United States Patent
Khosravani

(10) Patent No.: US 10,739,389 B2
(45) Date of Patent: Aug. 11, 2020

(54) SYSTEMS AND METHODS FOR MEASURING THE ELECTRICAL CONTACT RESISTANCE AT AN INTERFACE

(71) Applicant: The Boeing Company, Chicago, IL (US)

(72) Inventor: Shahriar Khosravani, Everett, WA (US)

(73) Assignee: The Boeing Company, Chicago, IL (US)

( * ) Notice: Subject to any disclaimer, the term of this patent is extended or adjusted under 35 U.S.C. 154(b) by 50 days.

(21) Appl. No.: 15/923,436

(22) Filed: Mar. 16, 2018

(65) Prior Publication Data

US 2019/0285675 A1    Sep. 19, 2019

(51) Int. Cl.
*G01R 27/26* (2006.01)
*G01B 7/06* (2006.01)
*C23C 14/54* (2006.01)

(52) U.S. Cl.
CPC ........... *G01R 27/2629* (2013.01); *G01B 7/06* (2013.01); *C23C 14/545* (2013.01)

(58) Field of Classification Search
CPC ...... G01R 27/2629; G01B 7/06; C23C 14/545
USPC ........................................................ 427/9, 58
See application file for complete search history.

(56) References Cited

U.S. PATENT DOCUMENTS

| | | | |
|---|---|---|---|
| 4,755,904 A | 7/1988 | Brick | |
| 6,729,531 B2 | 5/2004 | Stevenson et al. | |
| 7,887,268 B2 | 2/2011 | Mathis | |
| 2010/0044094 A1* | 2/2010 | Oka | H05K 3/44 174/264 |
| 2010/0227131 A1* | 9/2010 | Yang | H01L 22/34 428/198 |
| 2013/0057312 A1* | 3/2013 | Pagani | H01L 21/76898 324/762.01 |
| 2013/0099490 A1 | 4/2013 | Kwon et al. | |
| 2014/0244202 A1* | 8/2014 | Campi, Jr. | G01R 31/2884 702/117 |
| 2016/0169945 A1* | 6/2016 | Mauder | G01R 31/3274 324/126 |
| 2016/0229552 A1 | 8/2016 | Gross et al. | |
| 2017/0089973 A1* | 3/2017 | Sun | G01R 31/2607 |

* cited by examiner

*Primary Examiner* — Brian K Talbot
(74) *Attorney, Agent, or Firm* — Ostrager Chong Flaherty & Broitman P.C.

(57) ABSTRACT

A method for measuring a contact resistance at an interface of an electrically conductive coating and a cross-ply surface of a composite layer having electrically conductive fibers. The method includes: placing a dielectric coating of a sensing pad in contact with the composite layer or with the electrically conductive coating on the cross-ply surface of the composite layer; electrically connecting first and second input terminals of a comparator to the sensing pad and to one side of a capacitor respectively; electrically connecting another side of the capacitor to a fixed resistance; electrically connecting the fixed resistance to an electrically conductive body inserted in a hole in the composite layer; supplying an alternating current to the electrically conductive body and to the fixed resistance; and outputting a characteristic voltage signal if an amplitude of the input signal at the first input terminal is at least equal to an amplitude of the input signal at the second input terminal.

19 Claims, 21 Drawing Sheets

SYSTEMS AND METHODS FOR MEASURING THE ELECTRICAL CONTACT RESISTANCE AT AN INTERFACE

BACKGROUND

This disclosure generally relates to the measurement of electrical contact resistance. The term "contact resistance" refers to the contribution to the total resistance of a system which can be attributed to the contacting interfaces of electrical connections as opposed to intrinsic resistance. In particular, this disclosure relates to systems, apparatus, and methods for measuring electrical contact resistance at an interface of an electrically conductive coating and a cross-ply surface of a layer of carbon fiber-reinforced plastic (CFRP) material.

It is rather problematic to use the traditional two-contact resistance measurement in an aircraft environment to monitor and/or verify coating in joint holes because the second contact terminal must be a part of aircraft structure. This introduces a new resistance variable that is location dependent.

SUMMARY

Although various embodiments of apparatus and methods for measuring the electrical contact resistance at an interface of a cross-ply surface of a CFRP laminate and a coating made of electrically conductive material (e.g., low-melting alloy) will be described in some detail below, one or more of those embodiments and other embodiments not specifically disclosed may be characterized by one or more of the following aspects. As used herein, the term "low-melting alloy" refers to alloys having a melting temperature in a range greater than 170° F. and less than 300° F.

One aspect of the subject matter disclosed in detail below is a method for measuring a contact resistance at an interface of an electrically conductive coating and a cross-ply surface of a composite layer made of fiber-reinforced plastic having electrically conductive fibers. The method comprises: (a) placing a dielectric coating of a sensing pad in contact with the composite layer or with the electrically conductive coating on the cross-ply surface of the composite layer; (b) electrically connecting a first input terminal of a comparator to the sensing pad; (c) electrically connecting a second input terminal of the comparator to one side of a capacitor; (d) electrically connecting another side of the capacitor to a fixed resistance; (e) electrically connecting the fixed resistance to an electrically conductive body inserted in a hole in the composite layer; (f) supplying an alternating current to the electrically conductive body and to the fixed resistance; and (g) while the alternating current is being supplied, outputting a characteristic voltage signal if an amplitude of a first input signal from the sensing pad received at the first input terminal of the comparator is at least equal to an amplitude of a second input signal from the capacitor received at the second input terminal of the comparator. The fixed resistance is equal to a target contact resistance at the interface.

In accordance with some embodiments of the method described in the preceding paragraph, the cross-ply surface of the composite layer is a hole and the electrically conductive body is a fastener or hole coating applicator inserted in the hole. The electrically conductive coating is disposed between the fastener and the hole. In accordance with other embodiments, the electrically conductive coating is disposed on an edge of the composite material near the fastener. In a proposed implementation, the electrically conductive fibers are carbon fibers and the electrically conductive coating is made of low-melting alloy (LMA).

Another aspect of the subject matter disclosed in detail below is a method for applying an electrically conductive coating on a hole in a composite layer using a rotating hole coating applicator that comprises abradable electrically conductive material. The method comprises: capacitively coupling a sensing pad of a resistance measuring circuit to the composite layer; electrically connecting a contact terminal of the resistance measuring circuit comparator to the hole coating applicator; inserting the hole coating applicator in the hole; rotating the hole coating applicator in the hole while the abradable electrically conductive material is in contact with the hole to cause particles of the electrically conductive material to be abraded and deposited on the hole; supplying an alternating current from the resistance measuring circuit to the hole coating applicator by way of the contact terminal; while the alternating current is being supplied, outputting a characteristic voltage signal from the resistance measuring circuit when an amplitude of a signal from the sensing pad reaches a value that is indicative that a desired amount of electrically conductive material has been deposited on the hole; and ceasing rotation of the hole coating applicator after the characteristic voltage signal is output.

A further aspect of the subject matter disclosed in detail below is a resistance measuring circuit comprising: a sensing pad; a contact terminal; a junction electrically connected to the contact terminal; an alternating current source electrically connected to the junction; a fixed resistance electrically connected to the junction; a capacitor having one side electrically connected to the fixed resistance; a comparator having a first input terminal electrically connected to the sensing pad and a second input terminal electrically connected to another side of the capacitor; and an integrator electrically connected to an output terminal of the comparator.

Yet another aspect of the subject matter disclosed in detail below is a bridge circuit comprising an operational amplifier having first and second terminals, an alternating current source, and first and second legs that operatively couple the alternating current source to the first and second terminals respectively of the operational amplifier. The first leg comprises a composite layer having a hole, an electrically conductive body disposed inside the hole and electrically connected to the alternating current source, an electrically conductive coating disposed between the electrically conductive body and the hole, a sensing pad capacitively coupled to the composite layer and electrically connected to the first terminal. The second leg comprises a fixed resistance electrically connected to the alternating current source, a capacitor having one side electrically connected to the fixed resistance and another side electrically connected to the second terminal. In one proposed implementation, the electrically conductive coating is made of low-melting alloy and composite layer is made of carbon fiber-reinforced plastic.

Other aspects of apparatus and methods for measuring the electrical contact resistance at an interface of a cross-ply surface of a CFRP laminate and a coating made of electrically conductive material (e.g., LMA) are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

Reference will hereinafter be made to the drawings in which similar elements in different drawings bear the same reference numerals.

DETAILED DESCRIPTION

Figure 1:
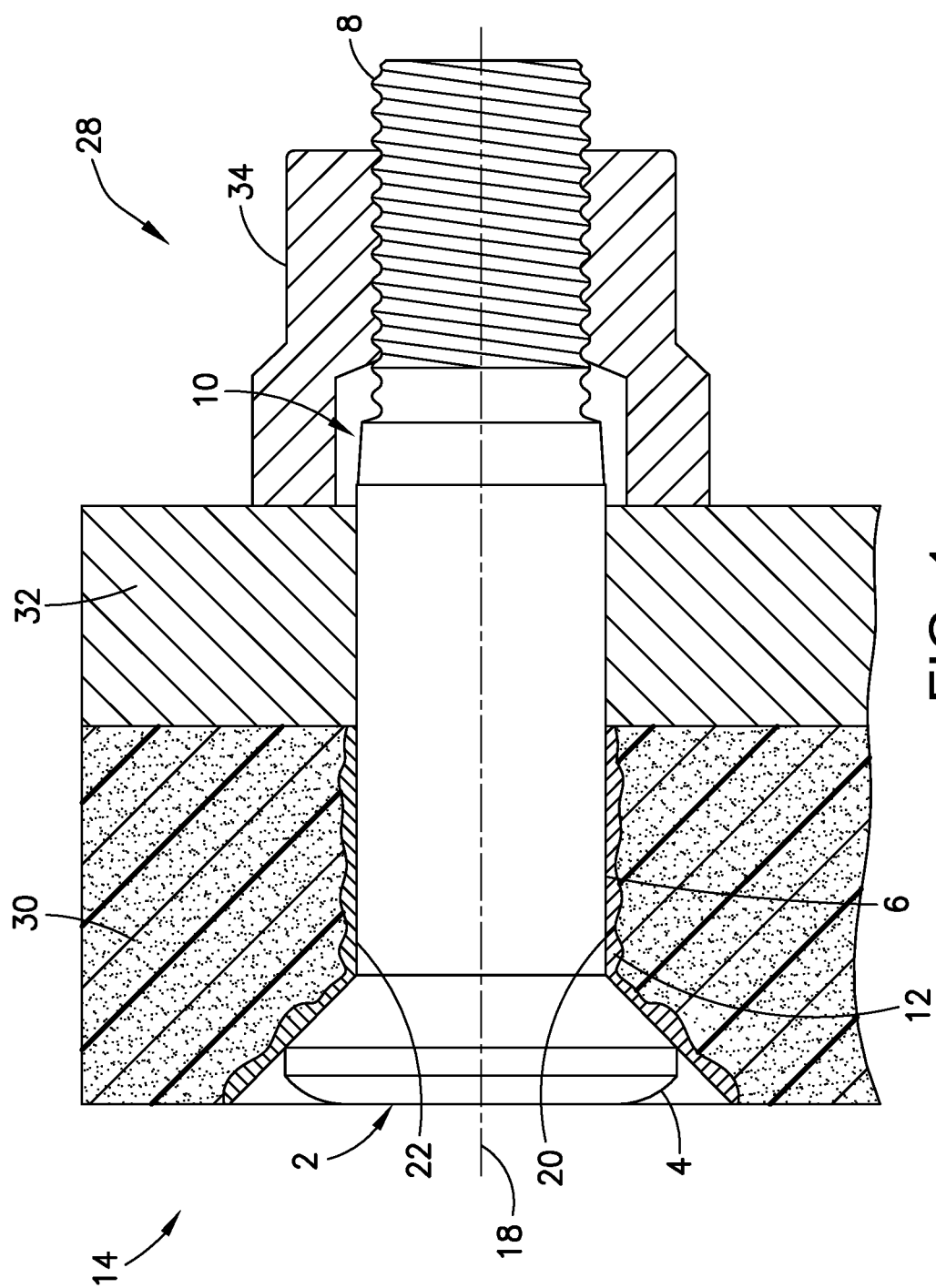
FIG. 1 is a diagram representing a partially sectioned view of an assembly including composite and metallic structures gripped by a sleeveless interference fit fastener assembly.

Various embodiments of systems, apparatus and methods for measuring the electrical contact resistance at an interface of a cross-ply surface (e.g., in a joint hole or at an edge) of a CFRP laminate and a coating made of electrically conductive material (e.g., low-melting alloy) will now be described in some detail for the purpose of illustration. At least some of the details disclosed below relate to optional features or aspects, which in some applications may be omitted without departing from the scope of the claims appended hereto.

The application of low-melting alloy (LMA) for coating joint holes in composite layers made of CFRP would benefit from the monitoring system described herein to verify the contact resistance to be within the acceptable range. The subject matter disclosed in some detail below is directed to systems, apparatus and methods for measuring the electrical contact resistance at a LMA/CFRP interface. The unique feature of the design proposed herein is its capacitive coupling segment that allows the system to measure resistance with one contact point only. A sensing pad is provided with a dielectric layer that is placed in contact with a surface area surrounding the hole (in the case of a coated hole) or in contact with a coated edge to form a capacitor. This capacitor can be used to determine the thickness of the electrically conductive coating applied in the hole or on the edge.

To ensure that the coating is sufficiently thick to provide adequate fiber connectivity at a hole or edge interface, a monitoring system can be employed to verify that the contact resistance is within an acceptable range. The monitoring system disclosed in some detail hereinafter utilizes the aforementioned capacitive coupling to measure the effective resistance of the LMA resistance and the random parallel resistance of the carbon fibers in the CFRP layer in series. In cases where joint holes, which extend through and are perpendicular to the plies of the composite laminate, are coated with electrically conductive material such as LMA, the resistance measuring circuit proposed herein can be used to effectively measure the coating thickness during either coating application (with reference to the applicator) or fastener insertion (with reference to the fastener). In cases where the edge of a composite layer is coated with electrically conductive material, the resistance measuring circuit proposed herein can be used to effectively measure the coating thickness after coating application with reference to a near-edge fastener.

The coating technique proposed herein involves applying the LMA cold (e.g., at room temperature) and depositing a thin layer of LMA on the hole or edge through abrasion (similar to a chalk-on-board effect). This primary layer of LMA produces a repeatable and consistent coating over the CFRP surface. The proposed method produces a distinct microstructure of LMA on CFRP that significantly improves the LMA/CFRP interface quality and connectivity. It can also significantly improve the LMA coating quality and quantity when applied to a titanium fastener. Optionally, a second deposit of LMA in a molten state can be applied. In that event, the molten LMA easily spreads on the primary layer of LMA to create a closer-to-perfect final coating.

If a capacitive coupling is utilized during a hole coating process, the effective resistance depends only on the hole interface resistance (i.e., it is LMA quality/quantity dependent). A feedback loop is used to control the LMA application process (applicator insertion and rotation) and confirm its completion to a satisfactory resistance level based on the response by the monitoring system. By depositing LMA to form a coating on the joint hole, concurrently measuring the effective resistance of the LMA and carbon fibers in series, and then ceasing deposition when a specified effective resistance is achieved, at least a minimum acceptable electrical conductivity at the hole/fastener interface can be achieved in the final structural assembly.

One illustrative embodiment of a structural assembly including a first structural element made of metallic material (e.g., a metal alloy) attached to a second structural element made of composite material (e.g., fiber-reinforced plastic) by means of a sleeveless interference fit fastener assembly will now be described in detail with reference to FIG. 1. In accordance with that example, the fastener includes a pin, and the mating part includes a swaged collar that is interengaged with the external projections of the mating portion of the pin. However, the concepts disclosed herein also have application in other embodiments in which the fastener includes a bolt, and the mating part includes a nut having internal threads that are interengaged with the external projections of the mating portion of the bolt.

FIG. 1 is a diagram representing a partially sectioned view of a structural assembly 14 including a composite layer 30 having a hole 20 with a surface that has crevices. The structural assembly 14 also includes a coating 12 adhered to the hole 20 and filling the crevices. The coating 12 defines a circular cylindrical coated hole 22. The composite layer 30 has fibers made of electrically conductive material, and the coating 12 includes or is a LMA, which was applied while in a molten state. In the example depicted in FIG. 1, the structural assembly 14 further includes a metallic layer 32 disposed adjacent to and in contact with the composite layer 30.

The structural assembly 14 can also include a sleeveless interference fit fastener assembly 28 having a fastener 2 and a swaged collar 34. The fastener 2 includes a shank 6, a threaded portion 8, and a transition portion 10. In alternative embodiments, the fastener 2 may have external annular rings instead of external threads. Although FIG. 1 depicts a fastener 2 having a countersunk (i.e., flush) head 4, the fastener 2 may in the alternative have a protruding head. An interference fit is achieved by the coated hole 22 having an inner diameter that is less than the outer diameter of the shank 6 (e.g., a difference of a few thousandths of an inch).

The fastener 2 shown in FIG. 1 is inserted into the coated hole 22 and the unswaged collar (not shown in FIG. 1) is placed over a portion of the fastener 2. During the installation cycle of the fastener 2, the unswaged collar (in the form of a loose-fitting metal ring) is deformed around the fastener 2, which has locking grooves on the threaded portion 8, to form swaged collar 34. The fastener 2 and swaged collar 34 combine to form the fastener assembly 28. The bolts and pins are preferably made of a metal alloy such as titanium alloy, aluminum alloy, Inconel, or corrosion-resistant steel. The collars are preferably made of titanium alloy, aluminum alloy, or corrosion-resistant steel.

This disclosure proposes to improve the quality and connectivity of the coating/composite layer interface inside a joint hole (e.g., a joint hole of the type depicted in FIG. 1) by applying solid LMA that has a low abrasion resistance, rather than by applying molten LMA, to the surface of the composite material that forms the hole 20. Optionally, molten LMA can be applied over the solid LMA deposited in the hole to achieve a coated hole having a surface that is smoother than what can be achieved using solid LMA alone.

The process briefly described in the preceding paragraph may be applied to every joint hole in a composite layer to be included in a stack of layers to form a structural assembly 14, such as a structural part (e.g., of an aircraft). After all holes in all layers of composite material to be included in the structural assembly 14 have been coated with LMA, the layers of composite material and any other layers not made of composite material are placed in a stack such that the holes in the respective stacked layers are aligned. A respective fastener 2 is pre-heated (to liquefy the surface of the solidified material to enable hydroplaning during insertion, thereby reducing resistance) and then inserted into the coated hole 22 in the composite layer 30 with an interference fit. The swaged collar 34 is then coupled to the respective fastener 2. In each instance, at least a portion of the shank 6 of the fastener 2 is surrounded by the coating 12 made of electrically conductive material.

Figure 2:
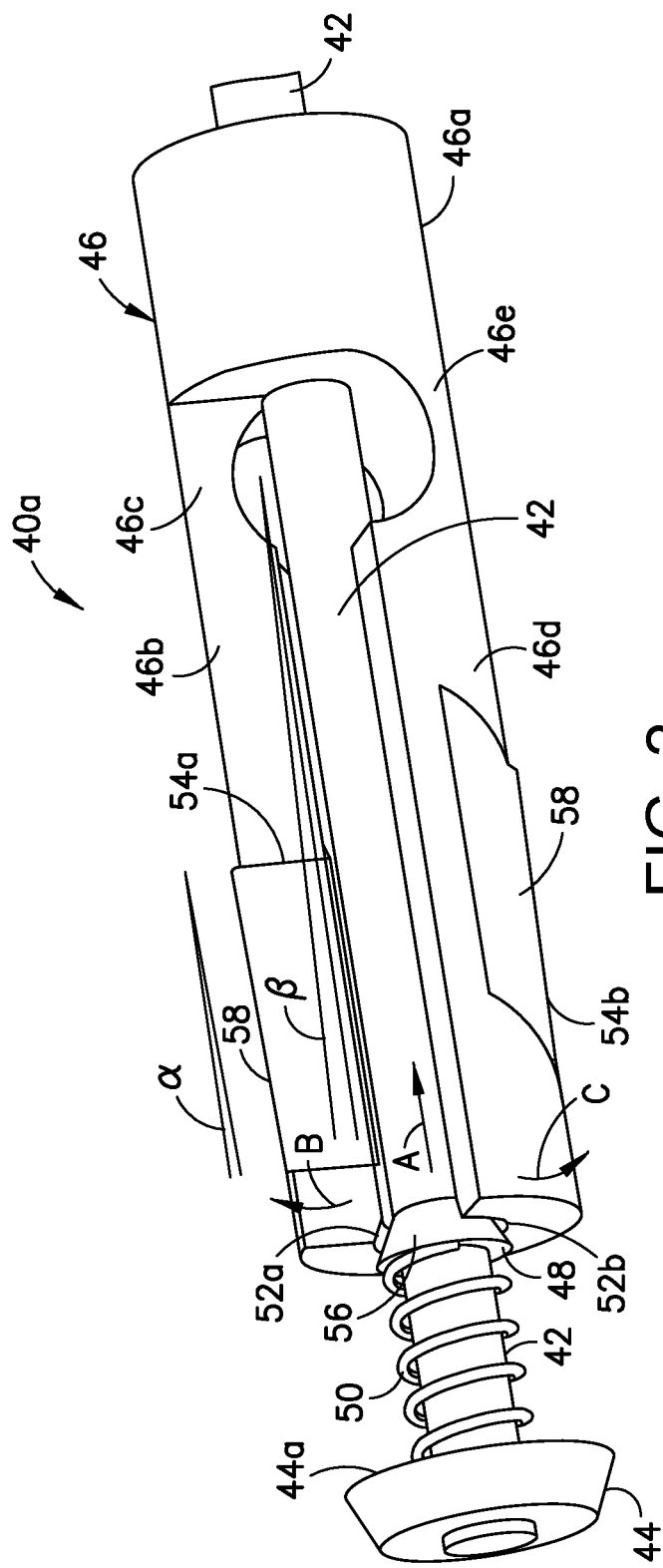
FIG. 2 is a cutaway diagram representing a view of portions of a hole coating applicator in accordance with a first embodiment.
Figure 3:
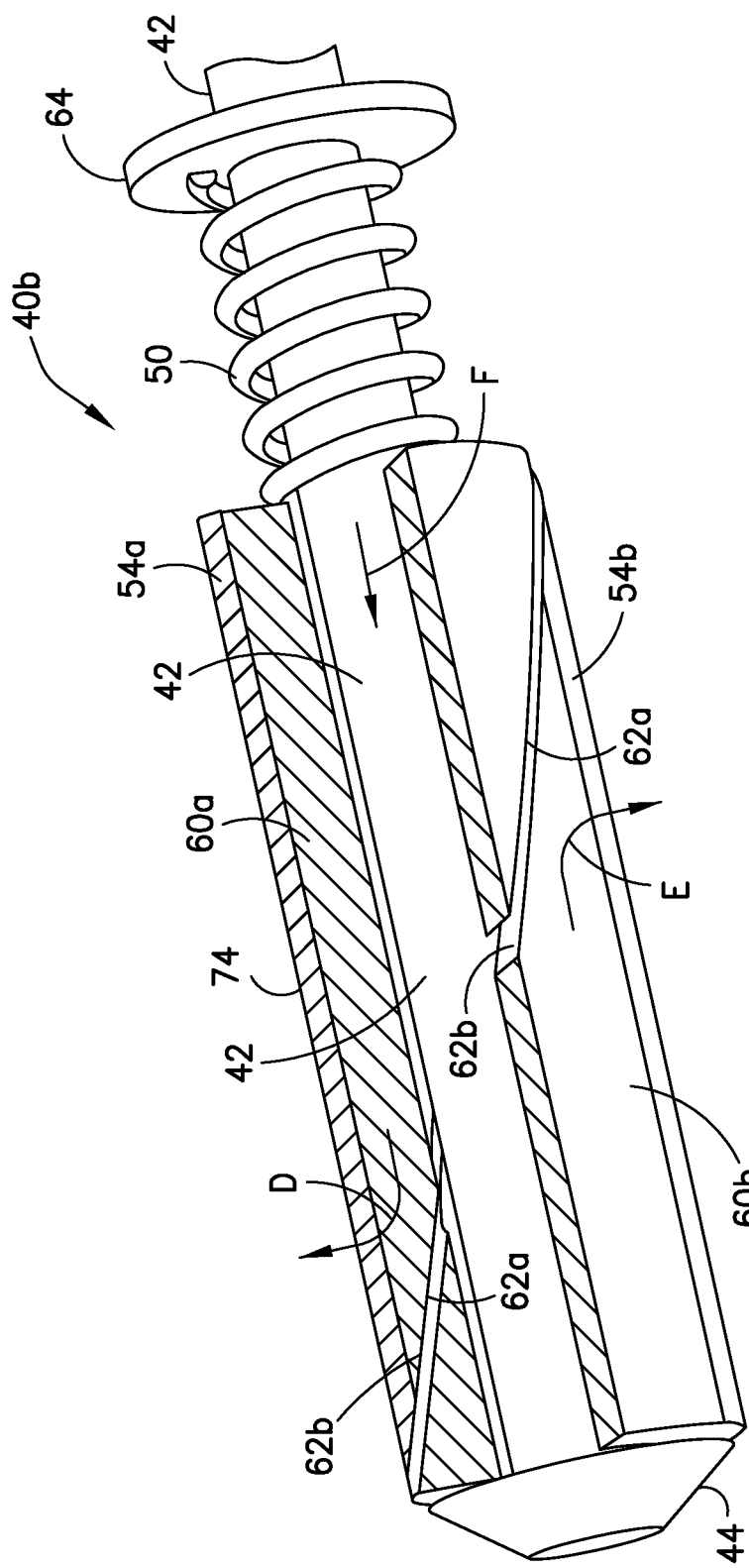
FIG. 3 is a cutaway diagram representing a view of portions of a hole coating applicator in accordance with a second embodiment.
Figure 4:
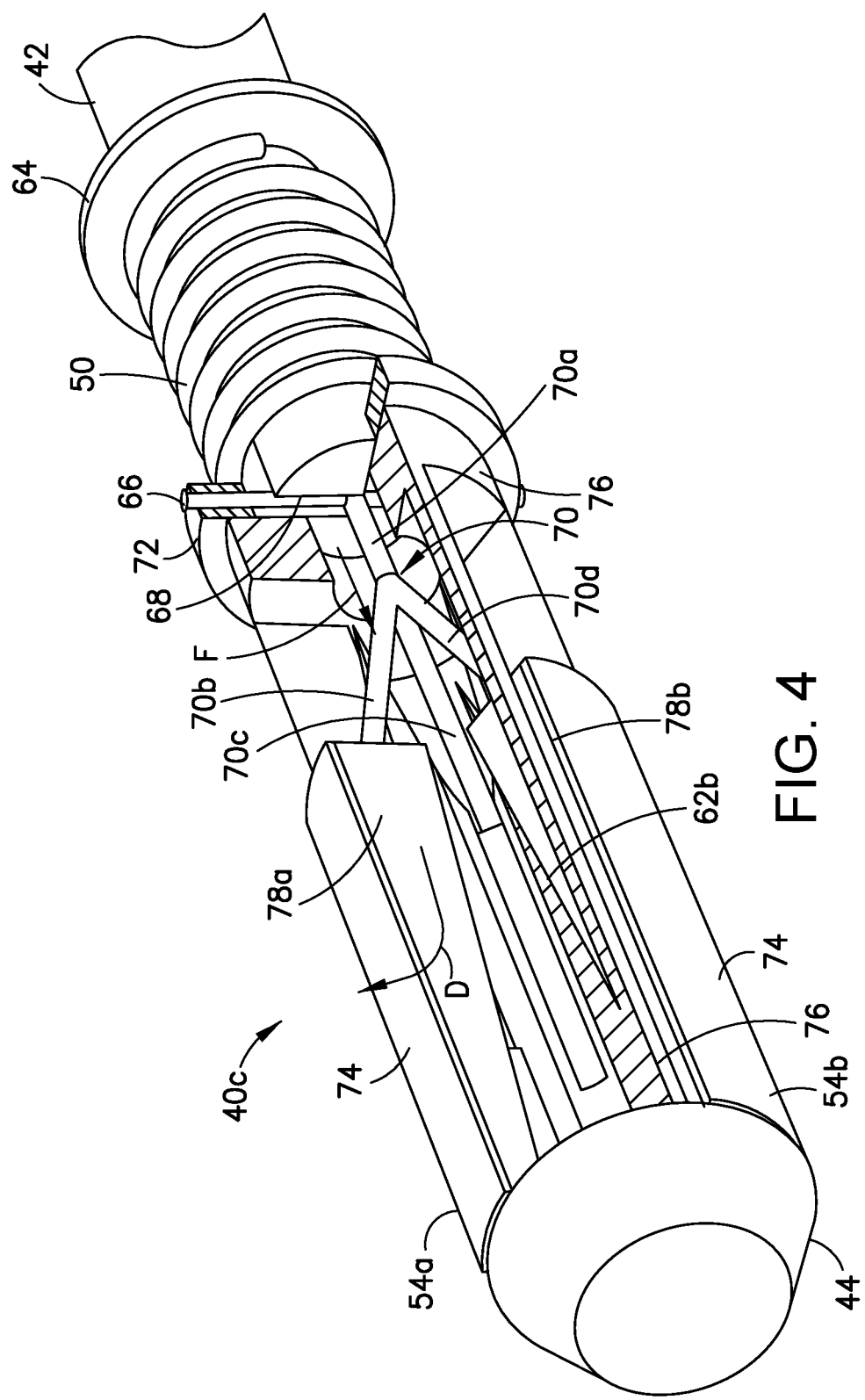
FIG. 4 is a cutaway diagram representing a view of portions of a hole coating applicator in accordance with a third embodiment.
Figure 4A:
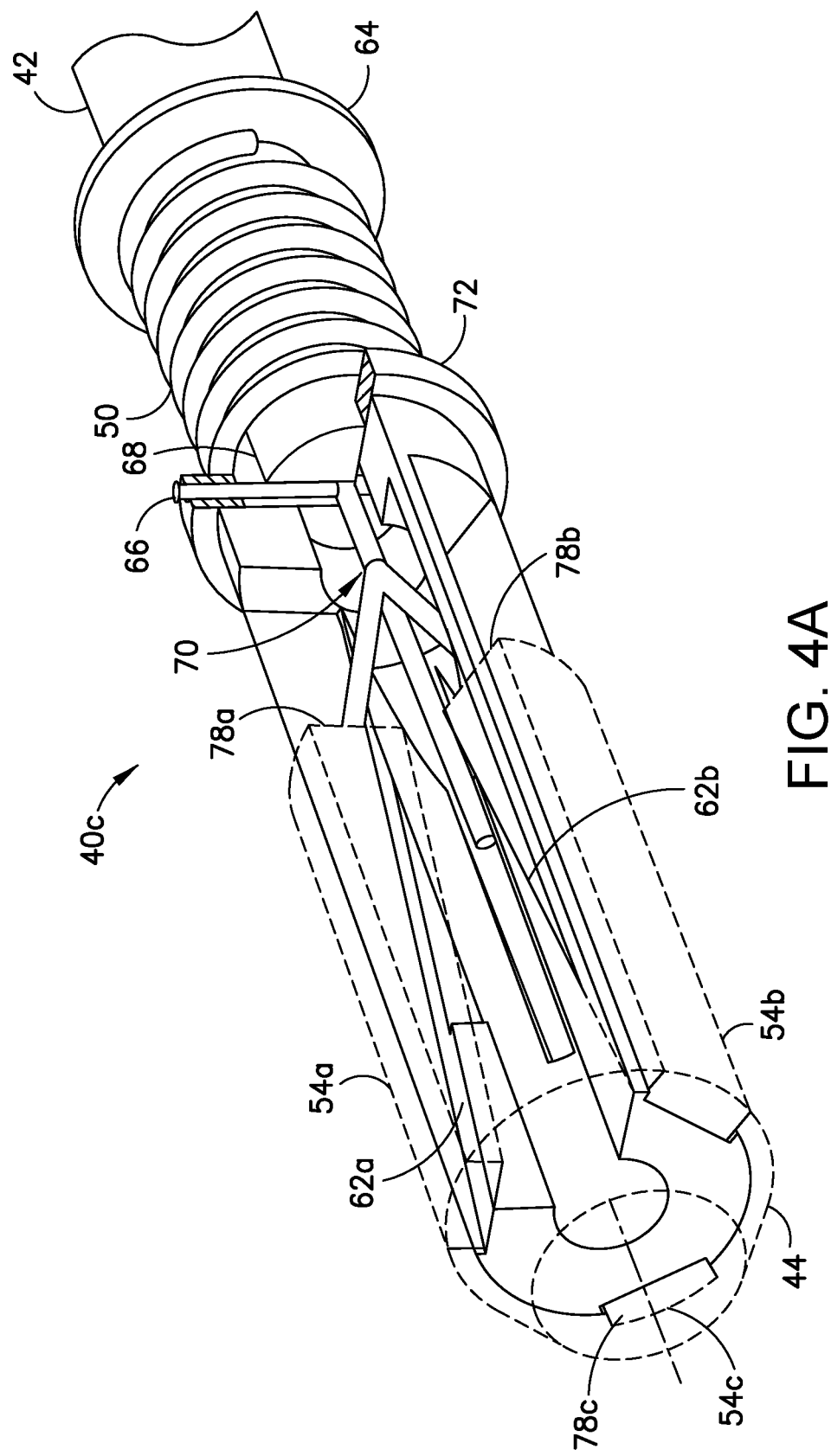
FIG. 4A is a cutaway diagram similar to FIG. 4 except that some components (indicated by dashed lines) of the hole coating applicator in accordance with the third embodiment have been removed to reveal additional internal structure and some hatching has been omitted to avoid clutter in the drawing.
Figure 8:
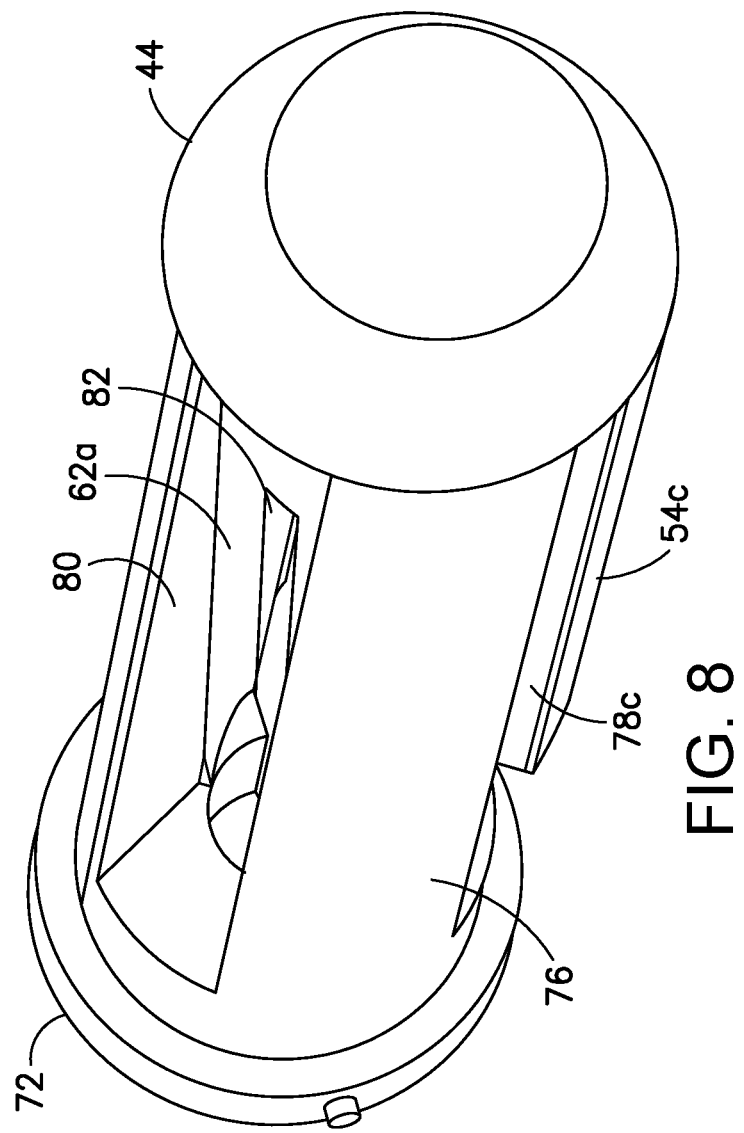
FIG. 8 is a diagram representing a view of the applicator body and the sliding annular ring in accordance with the third embodiment.
Figure 9:
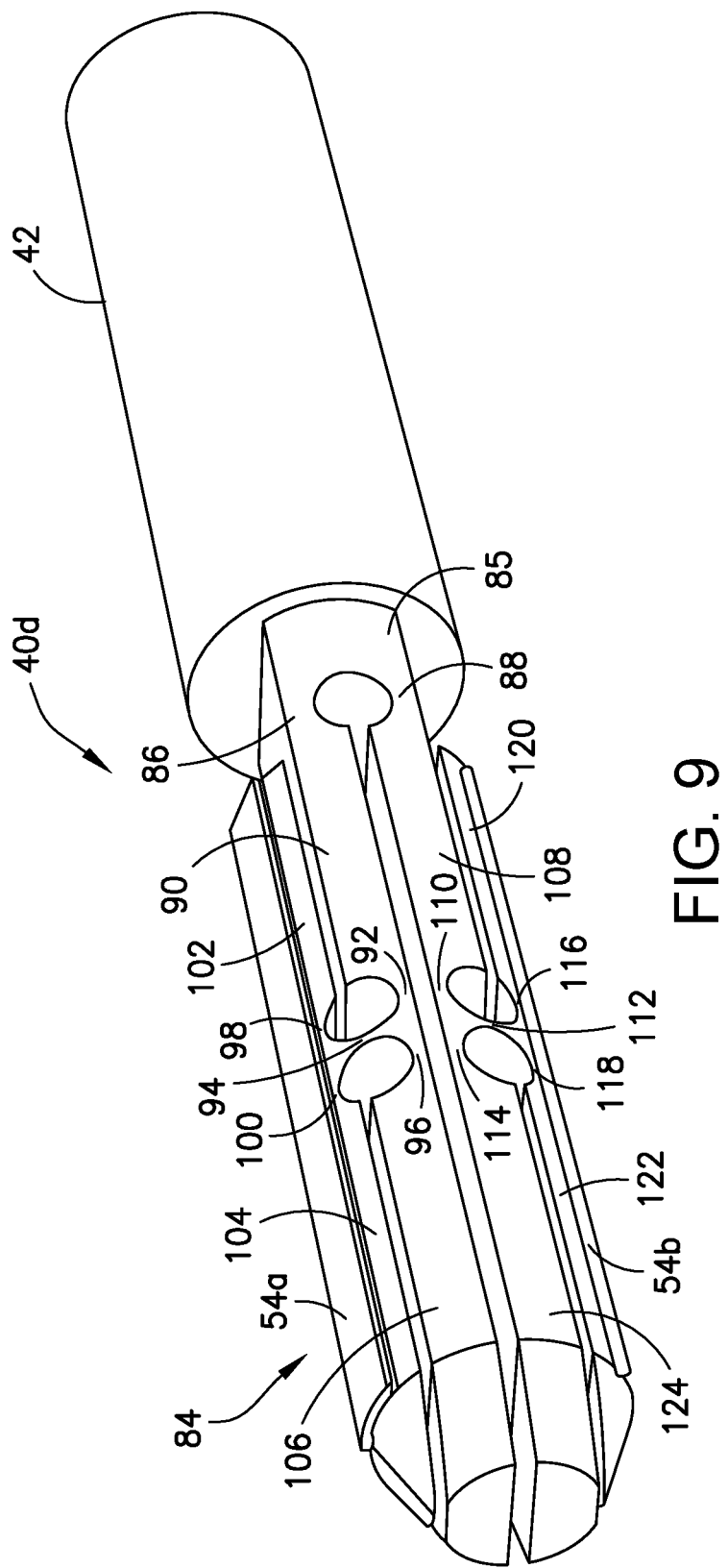
FIGS. 9 and 10 are diagrams representing different views of a hole coating applicator in accordance with a fourth embodiment.
Figure 10:
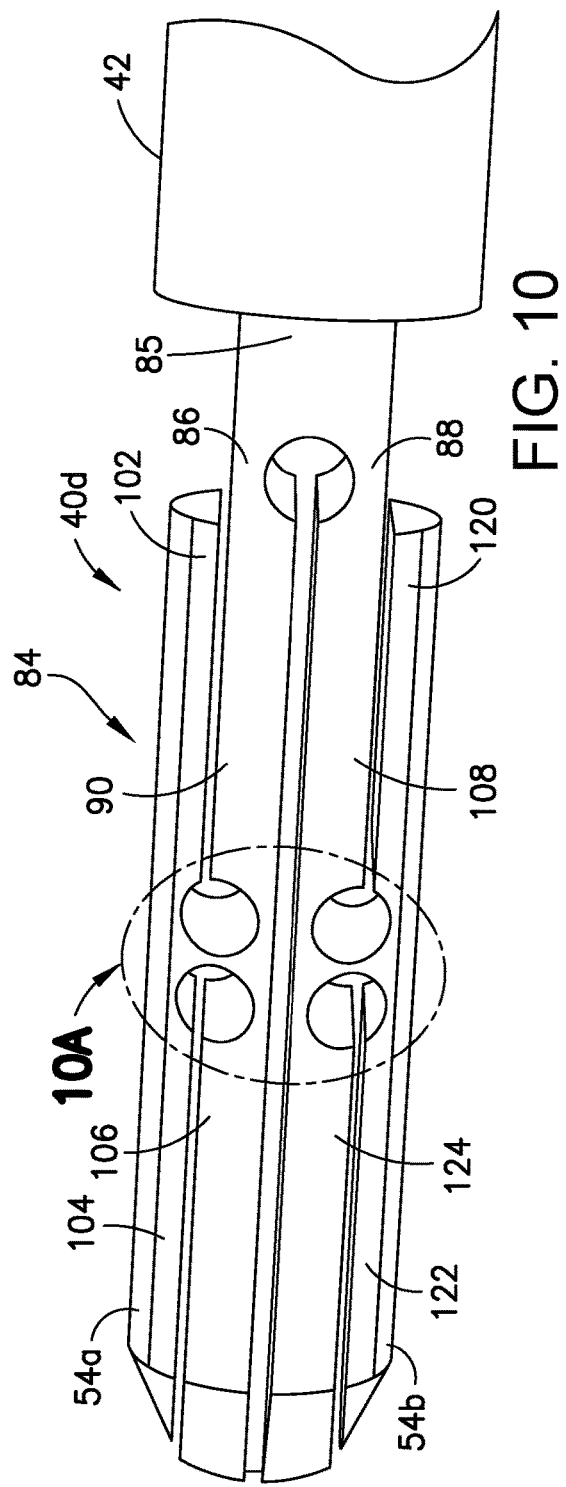
Figure 10A:
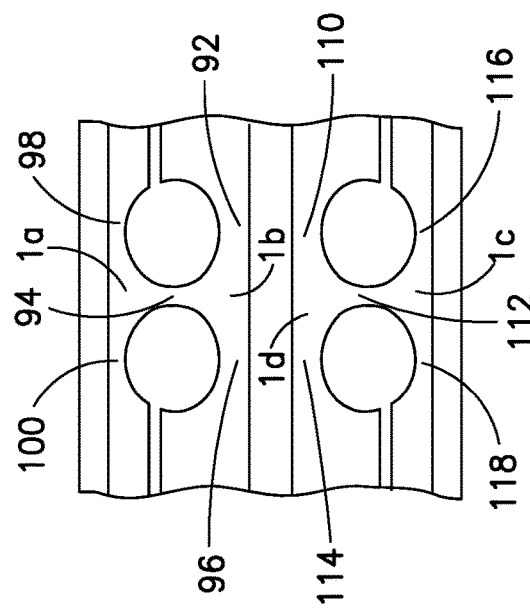
FIG. 10A is a diagram representing a magnified view of the portion of the hole coating applicator within the dashed ellipse 10A indicated in FIG. 10.

Various embodiments of apparatus for applying solid LMA in a joint hole, such as the hole 20, will now be disclosed with reference to FIGS. 2-10 (and FIGS. 4A and 10A). Each of these embodiments includes a hole coating applicator 40 (see FIG. 15) that may be coupled to the end effector (e.g., a chuck 154) of a machine that has a rotatable and vertically displaceable spindle 150. The common aspect of the embodiments disclosed below is that the hole coating applicator 40 is configured to coat a surface defining a hole 20 by depositing a coating 12 made of electrically conductive material through friction as the hole coating applicator 40 rotates. In accordance with some embodiments, the hole coating applicator 40 includes a shaft 42, which can be gripped by a chuck 154 mounted on the end of a spindle 150 of a stationary drilling machine or a drilling tool attached to a robot or other automated apparatus. The hole coating applicator 40 further includes one or more LMA pads 58a-58c that contact the surface defining the hole 20 in the composite layer 30 with sufficient force to abrade the LMA pads 58a-58c as the spindle 150 rotates. As used herein, the term "LMA pad" refers to a solid block or layer of LMA having a thickness (which may vary along its length) and an outer peripheral surface 74 contoured to rub against the hole 20 during rotation of the hole coating applicator 40.

FIG. 2 is a cutaway diagram representing a view of portions of a hole coating applicator 40a in accordance with a first embodiment. The hole coating applicator 40a includes a shaft 42 having a distal end and an applicator body 46 fixedly coupled to an intermediate portion of shaft 42. The shaft 42 and applicator body 46 are made of metallic alloys, neither of which is low-melting alloy (LMA).

In accordance with the first embodiment, the applicator body 46 includes a non-flexural portion 46a, a first flexural element 46b and a second flexural element 46d. The non-flexural portion 46a is fixedly coupled to the intermediate portion of the shaft 42 at a distance from the distal end of the shaft 42. The first flexural element 46b is configured to bend relative to the non-flexural portion 46a due to flexure of a first flexural hinge 46c. The second flexural element 46d is configured to bend relative to the non-flexural portion 46a due to flexure of a second flexural hinge 46e. The first flexural hinge 46c directly connects the first flexural element 46b to the non-flexural portion 46a, and the second flexural hinge 46e directly connects the second flexural element 46d to the non-flexural portion 46a.

The hole coating applicator 40a further includes a first LMA pad 54a attached to the first flexural element 46b and a second LMA pad 54b attached to the second flexural element 46d. Each of the first and second LMA pads 54a and 54b has an outer peripheral surface 58 that is preferably a section of a right circular cylindrical surface having a radius approximately equal to the radius of the hole 20 (shown in FIG. 1) to be coated with LMA particles. The LMA pads 54a and 54b extend beyond the outer peripheral surfaces of the first and second flexural elements 46b and 46d so that the outer peripheral surfaces of the first and second flexural elements 46b and 46d do not contact the surface defining the hole 20 and the outer peripheral surfaces 58 contact the hole 20 during rotation of the hole coating applicator 40a.

The hole coating applicator 40a can further include a nose 44 having a truncated right circular conical surface. The nose 44 is mounted to the distal end of shaft 42. The tapered circumferential surface of the nose 44 facilitates passage of the nose 44 through the hole 20 during insertion of hole coating applicator 40a. The base 44a of the nose 44 serves as an end stop for a retention spring 50, which is wrapped around a portion of the shaft 42 as seen in FIG. 2. The other end of the retention spring 50 contacts a slider 48 that is slidably coupled to the shaft 42 in a vicinity of the distal ends of the first and second flexural elements 46b and 46d. The distal end of the first flexural element 46b has a circumferential portion of a truncated right circular conical surface 52a, and the distal end of the second flexural element 46d has a circumferential portion of a truncated right circular conical surface 52b. The slider 48 is in the form of a truncated right circular cone having a bore through which the shaft 42 is passed. The outer circumferential surface of slider 48 is a truncated right circular conical surface that abuts the circumferential portions of truncated right circular conical surfaces 52a and 52b of the first and second flexural elements 46b and 46d when the slider 48 is in an abutting position.

The retention spring 50 applies a spring force on the slider 48 that causes the slider 48 to slide axially in the direction indicated by arrow A in FIG. 2. During this slider movement, the third truncated right circular conical surface deflects the distal ends of the first and second flexural elements in opposite directions (indicated by arrows B and C in FIG. 2) away from the shaft 42. More specifically, the contact force exerted by the slider 48 causes the first flexural element 46b to undergo an angular displacement through an angle β. This angular displacement is enabled by the flexure that occurs at the first flexural hinge 46c. The second flexural element 46d undergoes a similar angular displacement due to flexure of the second flexural hinge 46e. In anticipation of these angular deflections, the outer peripheral surfaces 58 of the LMA pads 54a and 54b are tilted by an angle α to compensate for the displacement angle β. This compensation can ensure that the outer peripheral surfaces 58 will be parallel to the hole to be coated, not tilted. This in turn can ensure that the entirety of each outer peripheral surface 58 is in contact with the hole and subject to abrasion when the hole coating applicator 40a is rotated while inside the hole. Preferably the axis of shaft 42 will be coaxial with the axis of the hole during rotation of the hole coating applicator 40a.

FIG. 3 is a cutaway diagram representing a view of portions of a hole coating applicator 40b in accordance with a second embodiment. The hole coating applicator 40b includes a shaft 42 having a distal end, a nose 44 attached to the distal end of shaft 42, and a backstop flange 64 attached to an intermediate portion of shaft 42 at a distance from the nose 44. The hole coating applicator 40b further include a pair of camming half-bodies 60a and 60b, which are loosely coupled to the shaft 42. Each of the camming half-bodies 60a and 60b has a respective camming surface 62a and 62b. The respective camming surfaces 62a and 62b confront each other and, when one is pushed toward the other, come into contact. Each of the camming half-bodies 60a and 60b also has an outer peripheral surface that is a section of a right circular cylindrical surface. The hole coating applicator 40b further includes respective LMA pads 54a and 54b adhered to portions of the respective outer peripheral surfaces of camming half-bodies 60a and 60b. The LMA pads 54a and 54b in turn have respective outer peripheral surfaces 74, which are right circular cylindrical surfaces having a radius that matches the radius of the hole to be coated, as previously described. Each of the LMA pads 54a and 54b may have a constant thickness.

The hole coating applicator 40b further includes a retention spring 50, which is wrapped around a portion of the shaft 42 as seen in FIG. 3. The backstop flange 64 serves as an end stop for the retention spring 50. The other end of the retention spring 50 contacts an end face of the camming half-body 60a. The retention spring 50 applies a spring force on the camming half-body 60a that urges the camming half-body 60a to move axially in the direction indicated by arrow F in FIG. 3. During this movement, the camming surface 62b of camming half-body 60b deflects the camming half-body 60a so that the movement of the camming half-body 60a (indicated by arrow D in FIG. 3) has both an axial component and a radially outward component. In addition, the camming surface 62a of camming half-body 60a cams the camming half-body 60b so that camming half-body 60b also moves radially outward in a direction opposite to the radially outward movement of camming half-body 60a (indicated by arrow E in FIG. 3). The effect of this radial expansion of the camming half-bodies 60a and 60b is to press the outer peripheral surfaces of the LMA pads 54a and 54b against opposing sides of the hole during rotation of the hole coating applicator 40b. The magnitude of the pressure exerted is designed to produce frictional forces sufficient to abrade the LMA pads during rotation of the hole coating applicator 40b, causing the deposition of LMA particles on the hole. This deposition is continued until a desired thickness of the coating 12 in a hole 20 is achieved.

FIG. 4 is a cutaway diagram representing a view of portions of a hole coating applicator 40c in accordance with a third embodiment. FIG. 4A is a cutaway diagram similar to FIG. 4 except that some components (indicated by dashed lines) of the hole coating applicator 40c have been removed to reveal additional internal structure and some hatching has been omitted to avoid clutter in the drawing.

As seen in FIG. 4, the hole coating applicator 40c includes a shaft 42, an applicator body 76 integrally formed with or joined to a distal end of the shaft 42, a nose 44 attached to the distal end of the applicator body 76, and a backstop flange 64 attached to an intermediate portion of shaft 42 at a distance from applicator body 76. The hole coating applicator 40c further include three camming blocks 78a-78c, which are slidably coupled to the applicator body 76 for sliding along respective camming surfaces 62a, 62b formed inside the applicator body 76. Only two camming surfaces 62a and 62b of the three camming surfaces are visible in FIGS. 4A and 5. Each camming block 78a-78c has a respective inclined surface that confronts and contacts the camming surfaces 62a, 62b formed inside the applicator body 76.

FIG. 8 provides some insight into the construction of the applicator body 76 in accordance with the third embodiment. The camming block 78a has been removed to reveal the camming surface 62a, which borders an opening 82 on three sides. The push rod link 70d passes through the opening 82. Movement of the camming block 78a is constrained in transverse directions by a pair of mutually opposing planar guide walls 80, only one of which is visible in FIG. 8. Movement of the camming block 78a is constrained in the radially outward direction by any suitable means. For example, the guide walls 80 may be provided with projections that engage linear channels formed in the corresponding camming block 78a to prevent the camming block 78a from falling out of the applicator body 76.

Accordingly, any movement of the camming blocks 78a-78c toward the nose 44 can result in the camming blocks 78a-78c moving parallel to the camming surfaces, which are inclined at an oblique angle relative to an axis of shaft 42. In other words, the movement of each camming block 78a-78c has both an axial component and a radially outward component, as indicated by arrow D in FIG. 4. The radial outward movements of the three camming blocks 78a-78c will be referred to herein as "radial expansion".

Each of the camming blocks 78a-78c also has an outer peripheral surface that is a section of a right circular cylindrical surface. The hole coating applicator 40c further includes respective LMA pads 54a-54c (only LMA pads 54a and 54b are visible in FIG. 4) adhered to the outer peripheral surfaces of camming blocks 78a-78c respectively. The LMA pads 54a-54c in turn have respective outer peripheral surfaces 74, which are right circular cylindrical surfaces having a radius that matches the radius of the hole to be coated, as previously described. Each of the LMA pads 54a-54c may have a constant thickness.

As best seen in FIG. 4, the trio of camming blocks 78a-78c are configured to move in unison in response to axial displacement of a push rod linkage 70 including a push rod 70a and three push rod links 70b-70d. Although pivotable couplings (e.g., revolute joints) are not shown in the drawings, the push rod links 70b-70d are pivotably coupled to one end of the push rod 70a. The other ends of the push rod links 70b-70d are pivotably coupled to the respective camming blocks 78a-78c. An end portion of the push rod 70a may be seated in an axial bore (not shown in the drawings) formed in the shaft 42 to constrain the movement of the push rod 70a to be axial only. As the push rod 70a is displaced axially toward the nose 44, the push rod links 70b-70d push the respective camming blocks 78a-78c along the respective inclined camming surfaces (only camming surfaces 62a and 62b are visible in FIGS. 4A and 5) to produce the desired radial expansion of the LMA pads 54a-54c into contact with the hole to be coated.

The hole coating applicator 40b can further includes a retention spring 50, which is wrapped around a portion of the shaft 42 as seen in FIG. 4. The backstop flange 64 serves as an end stop for the retention spring 50. The other end of the retention spring 50 contacts and exerts a spring force on an annular ring 72 that is slidable along the portion of shaft 42 around which the spring 50 is wrapped. The annular ring 72 is slidable between the end position depicted in FIGS. 4, 4A and 5), whereat the front surface of the annular ring 72 abuts an annular end face (hereinafter "end stop 77") of the applicator body 76 (end stop 77 is best seen in FIG. 6), and a position displaced from that end position (i.e., in a direction away from nose 44), whereat the retention spring is in a more compressed state than the state of compression when the annular ring 72 is at an end position.

Figure 5:
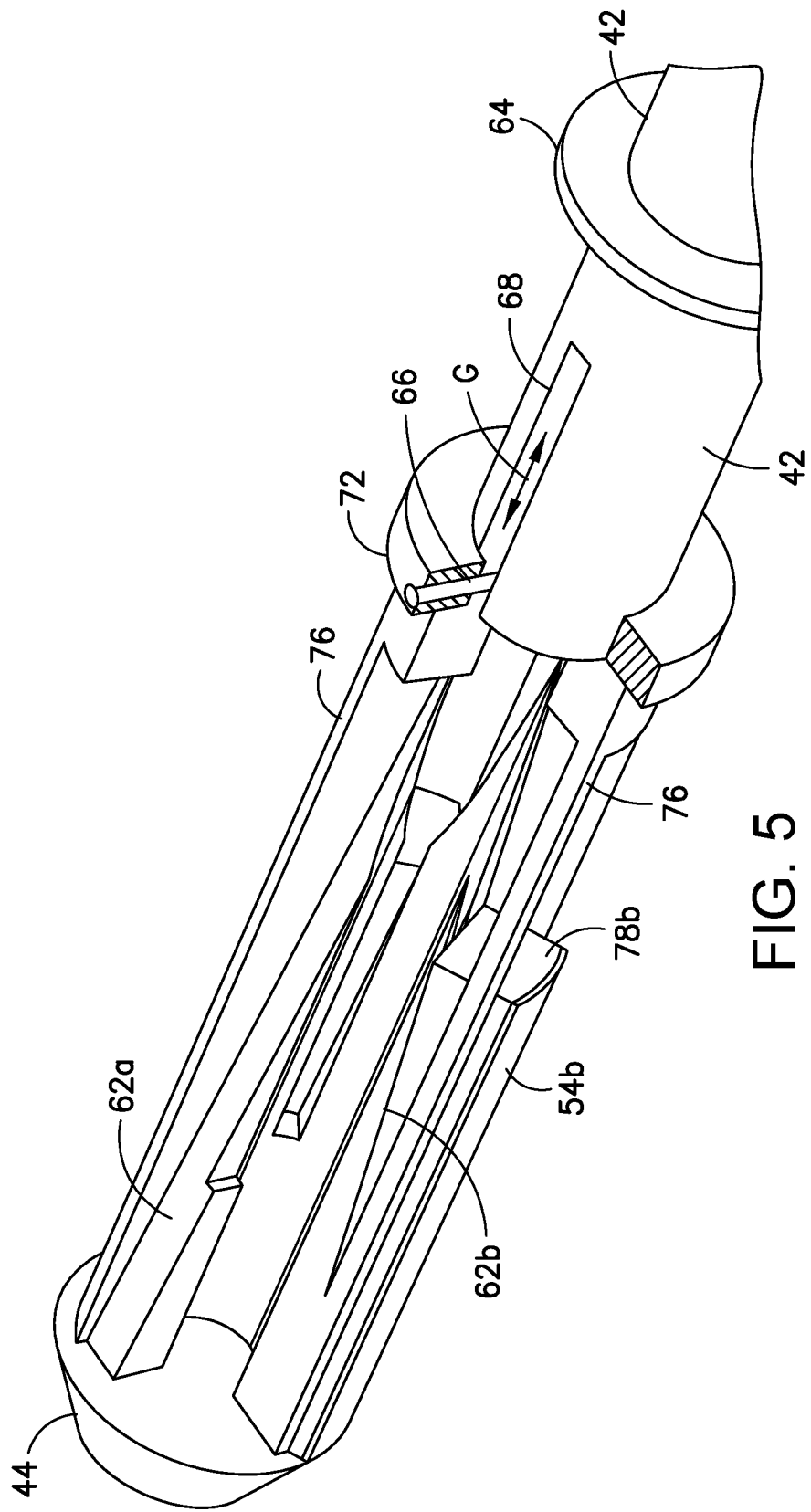
FIG. 5 is a cutaway diagram representing a different view of portions of the hole coating applicator in accordance with the third embodiment.
Figure 6:
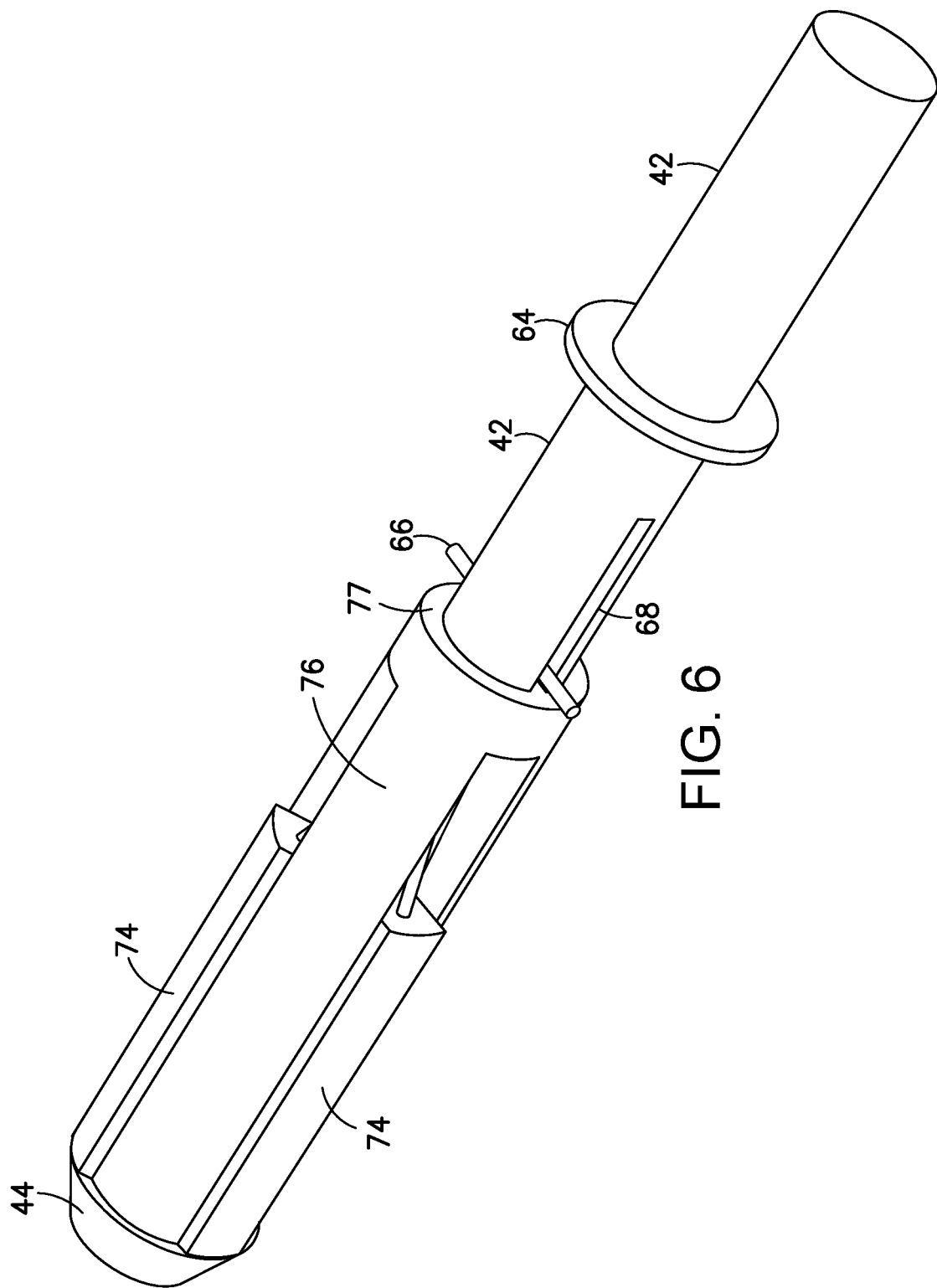
FIG. 6 is a diagram representing another view of the hole coating applicator in accordance with the third embodiment except that a sliding annular ring has been removed to reveal a transverse pin that slides in a slot formed in the shaft of the hole coating applicator.

The function of the annular ring 72 may be gleaned from the fact that the annular ring 72 has two diametrically opposed radial bores that hold a transverse pin 66, seen in FIGS. 4, 4A, and 5. As shown in FIG. 4, the transverse pin 66 is fixedly coupled to the push rod 70a so that the annular ring 72 and the push rod 70a move in tandem. This arrangement can enable the spring force of the retention spring 50 to axial displace the push rod 70a toward the nose 44 by pushing the annular ring 72 toward its end position, which in turn displaces the push rod linkage 70 toward the nose 44, thereby causing the LMA pads 54a-54c to radially expand into contact with the hole.

Figure 7:
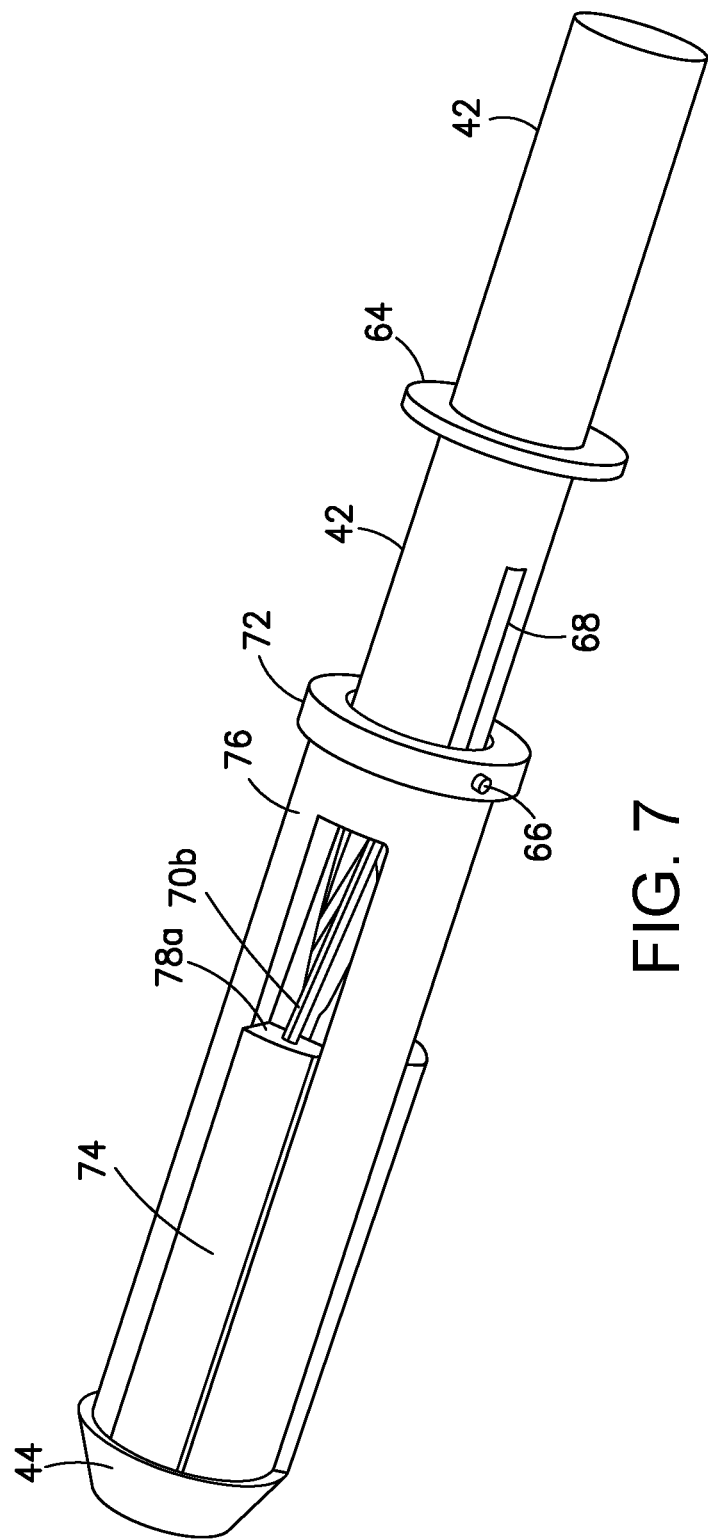
FIG. 7 is a diagram representing a view similar to the view in FIG. 6, but with the sliding annular ring in place adjacent an end stop formed by an applicator body integrally formed with or joined to the hole coating applicator shaft.

The portion of the transverse pin 66 that spans the opening of the annular ring 72 is seated in a slot 68 formed in the portion of shaft 42 around which the retention spring 50 is wrapped. The retention spring 50 has been omitted from each of FIGS. 5-7 in order to reveal the slot 68, which extends diametrically across and axially along the shaft 42. FIG. 5 shows the transverse pin 66 seated inside the slot 68. The transverse pin 66 is axially movable in either direction inside the slot 68, as indicated by the double-headed arrow G. FIG. 6 shows the transverse pin 66 with the annular ring 72 also omitted. FIG. 7 shows the annular ring 72 in an end position whereat the front face of the annular ring 72 abuts an annular end face (not visible in FIG. 7) of the applicator body 76.

The only interference section of the hole coating applicator 40c are the LMA pads 54a-54c and not the conical nose 44. The nose 44 guides the hole coating applicator 40c into the hole. The diameter of the base 44a of nose 44 is smaller than the hole diameter. The contact with the CFRP hole 20 occurs after the nose insertion. At this point, due to interference and friction, the LMA pads 54a-54c move down the inclined paths and compress the retention spring 50 on the back side until the outer peripheral surfaces 74 of the LMA pads 54a-54c contact the hole 20. The spring compression provides a steady outward radial force to sustain the firm contact between the LMA pads 54a-54c and the CFRP hole. The magnitude of the compressive force produces frictional forces sufficient to abrade the LMA pads 54a-54c during rotation of the hole coating applicator 40c, causing the deposition of LMA particles on the hole 20. This deposition is continued until a desired thickness of the coating 12 is achieved.

FIGS. 9 and 10 are diagrams representing different views of a hole coating applicator 40d in accordance with a fourth embodiment. The hole coating applicator 40a includes a shaft 42 having a distal end and a monolithic applicator body 84 fixedly coupled to or integrally formed with the distal end of shaft 42. (In the latter case, the shaft 42 and applicator body 84 collectively form a monolithic structure.) The shaft 42 and applicator body 84 are made of a metallic alloy that is not a low-melting alloy (LMA).

In accordance with the fourth embodiment, the applicator body 84 includes a non-flexural portion 85, a flexural element 90 and a flexural element 106. The non-flexural portion 85 is fixedly coupled to the distal end of the shaft 42. The flexural element 90 is configured to bend relative to the non-flexural portion 85 due to flexure of a flexural hinge 86. The flexural element 106 is configured to bend relative to the flexural element 90 due to flexure of flexural hinges 92 and 96. The flexural hinge 86 connects the flexural element 90 to the non-flexural portion 85, and the flexural hinges 92 and 96 connect the flexural elements 90 and 106 to each other. The applicator body 84 further includes a flexural element 102 and a flexural element 106. The flexural element 102 is configured to bend relative to the flexural elements 90 and 106 due to flexure of flexural hinges 94 and 98. The flexural element 104 is configured to bend relative to the flexural elements 90 and 106 due to flexure of flexural hinges 94 and 100. The flexural hinges 98 and 100 connect the flexural elements 90 and 106 to each other.

In accordance with the fourth embodiment, the applicator body 84 further includes a flexural element 108 and a flexural element 124. The flexural element 108 is configured to bend relative to the non-flexural portion 85 due to flexure of a flexural hinge 88. The flexural element 124 is configured to bend relative to the flexural element 108 due to flexure of flexural hinges 110 and 114. The flexural hinge 88 directly connects the flexural element 108 to the non-flexural portion 85. The flexural hinges 110 and 114 connect the flexural elements 108 and 124 to each other. The applicator body 84 further includes a flexural element 120 and a flexural element 122. The flexural element 120 is configured to bend relative to the flexural elements 108 and 124 due to flexure of flexural hinges 112 and 116. The flexural element 122 is configured to bend relative to the flexural elements 108 and 124 due to flexure of flexural hinges 112 and 118. The flexural hinges 116 and 118 connect the flexural elements 120 and 122 to each other.

Referring to FIG. 10A, the intersection 1a that connects the flexural hinges 94, 98, and 100 and the intersection 1b that connects the flexural hinges 92, 94, and 96 are connected by flexural hinge 94. The intersection 1c that connects the flexural hinges 112, 116, and 118 and the intersection 1d that connects the flexural hinges 110, 112, and 114 are connected by flexural hinge 112.

The foregoing structure enables every flexural element to bend relative to the non-flexural portion 85 of the applicator body 84 and relative to the shaft 42 due to flexure of one more flexural hinges. For example, the flexural element 102 is configured to bend relative to the non-flexural portion 85 due to flexure of flexural hinges 98, 94, 92, and 86; the flexural element 104 is configured to bend relative to the non-flexural portion 85 due to flexure of flexural hinges 100, 94, 92, and 86; the flexural element 120 is configured to bend relative to the non-flexural portion 85 due to flexure of flexural hinges 116, 112, 110, and 88; and the flexural element 122 is configured to bend relative to the non-flexural portion 85 due to flexure of flexural hinges 118, 112, 110, and 88. The monolithic hole coating applicator 40d has self-aligning and centering capabilities due to the flexural hinges.

The hole coating applicator 40d further includes a first LMA pad 54a attached to the outer peripheral surface of flexural elements 102 and 104 and intersection 1a. The hole coating applicator 40d can include a second LMA pad 54b attached to the outer peripheral surface of flexural elements 120 and 122 and intersection 1c. During rotation of the hole coating applicator 40d while applicator body 84 is inside a hole, the flexural elements bend radially outward into contact with the hole due to centripetal forces. Although not shown in FIGS. 9 and 10, the flexural elements 102 and 104 in an unflexed state may be tilted slightly toward the center axis of the hole coating applicator 40d so that radially outward bending during rotation produces alignment of the LMA pads 54a and 54b. The same is true for flexural elements 120 and 122. The speed of rotation of shaft 42 should be sufficiently high that the magnitude of the resulting frictional forces produced at the interface between the LMA pads 54a and 54b and the hole will cause the LMA to abrade and deposit on the hole. This deposition is continued until a desired thickness of the hole coating is achieved.

Figure 20:
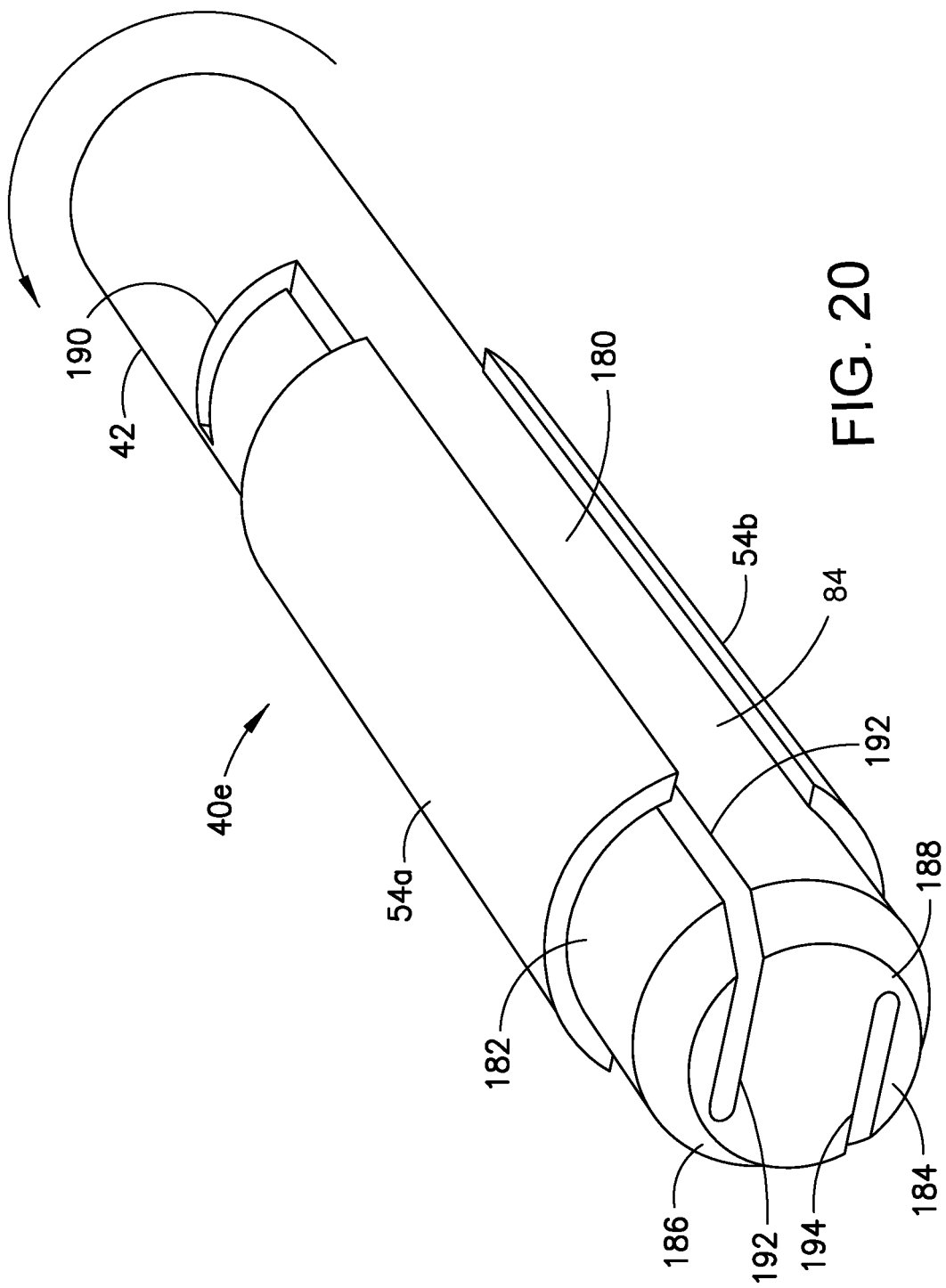
FIG. 20 is a diagram representing a view of portions of a hole coating applicator in accordance with a fifth embodiment.

FIG. 20 is a diagram representing a view of portions of a hole coating applicator 40e in accordance with a fifth embodiment. The hole coating applicator 40e includes a shaft 42 having a distal end and a monolithic applicator body 84 fixedly coupled to or integrally formed with the distal end of shaft 42. (In the latter case, the shaft 42 and applicator body 84 collectively form a monolithic structure.) The shaft 42 and applicator body 84 are made of a metallic alloy that is not a low-melting alloy (LMA).

In accordance with the fifth embodiment, the applicator body 84 includes a non-flexural portion 180, a radial flexural element 182 and a radial flexural element 184. The non-flexural portion 180 is fixedly coupled to the distal end of the shaft 42. The radial flexural element 182 is configured to bend relative to the non-flexural portion 180 due to flexure of an axial flexural hinge 186. The radial flexural element 184 is configured to bend relative to the non-flexural portion 180 due to flexure of an axial flexural hinge 188. The radial flexural element 182 is separated from the shaft 42 by a gap 190 and is separated from the non-flexural portion 180 by a gap 192. The radial flexural element 184 is separated from the shaft 42 by a gap (not visible in FIG. 17) and is separated from the non-flexural portion 180 by a gap 194.

The hole coating applicator 40e further includes a first LMA pad 54a attached to the outer peripheral surface of radial flexural elements 182 and a second LMA pad 54b attached to the outer peripheral surface of radial flexural element 184. During rotation of the hole coating applicator 40e while applicator body 84 is inside a hole, the radial flexural elements 182 and 184 will bend radially outward into contact with the hole due to centripetal forces. The use of radial flexural elements 182 and 184 may improve the LMA delivery to the CFRP surface with fewer turns. Also, the unidirectional spin (indicated by the curved arrow in FIG. 17) of the applicator allows a very stable response between the applicator and the CFRP surface. By adjusting the thickness of the axial flexural hinges 186 and 188 and by material selection, one can achieve a desired radial force. Also, the displacement is parallel to the hole. Lastly, the hinge orientation and rotational direction provide a smooth engagement between the CFRP and the LMA pads 54a and 54b.

Optionally, after a first coating made of solid LMA has been applied using one of the applicators disclosed above, a second coating of LMA may be applied over the first coating using molten LMA. The benefit of this two-stage application procedure is that the surface of the second coating may be smoother than the surface of the first coating.

Suitable LMAs include alloys of two or more elements of the following: bismuth, indium, tin, lead, and antimony. A preferred LMA is a ternary alloy consisting of a mixture of bismuth (preferably more than 50%), indium and tin. Due to its softness, the LMA performs like a solid lubricant and fastener insertion is easier with lower insertion force for interference fit.

To ensure that a sufficient amount of LMA is applied in a particular composite joint installation, a real-time monitoring system that includes a resistance measuring circuit 36 can be employed to verify that the contact resistance is within an acceptable range. The monitoring system disclosed in some detail hereinafter utilizes a capacitive coupling to measure the effective resistance of the LMA resistance and the random parallel resistance of the carbon fibers in the CFRP layer in series. The LMA resistance through the thickness is orders of magnitude less than the resistance of the CFRP layer. Therefore the LMA resistance can be ignored. For example, the LMA thickness variation makes the LMA resistance change by a few micro-Ohms while the interface resistance is about a few milli-Ohms. The net resistance variation is completely a function of carbon fiber connectivity at the hole interface, which in turn depends only on the quality and quantity of the LMA coating. The capacitive coupling segment described herein can allow the monitoring system to measure resistance with one contact point only. A feedback loop is used to control the LMA application process (applicator insertion and rotation) and confirm completion to a satisfactory resistance level based on the response by the monitoring system. By depositing LMA to form a coating on the joint hole, concurrently measuring the effective resistance of the LMA and carbon fibers in series, and then ceasing deposition when a specified effective resistance is achieved, at least a minimum acceptable electrical conductivity at the hole/fastener interface can be achieved in the final structural assembly.

Figure 11:
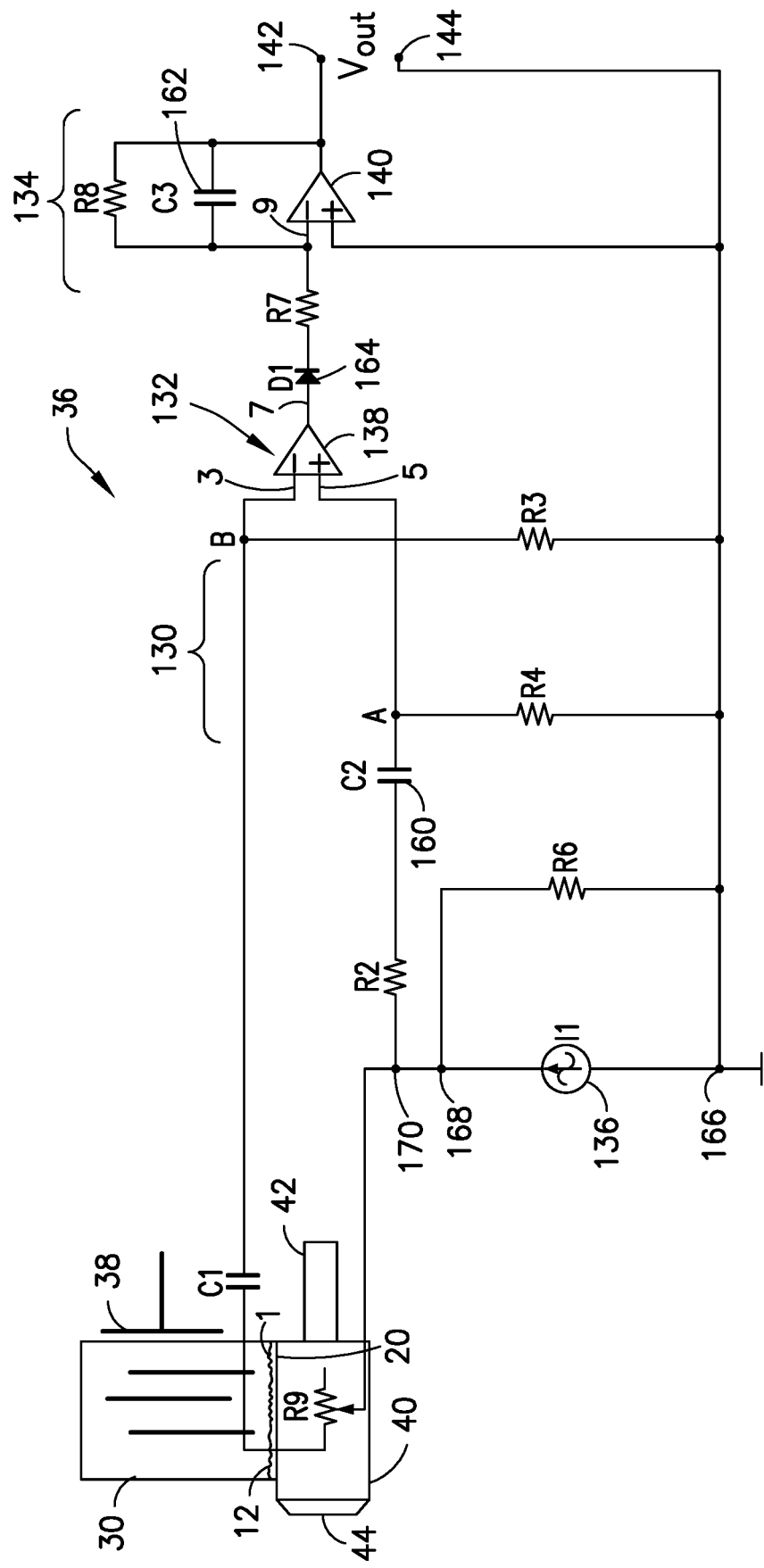
FIG. 11 is a circuit diagram representing electrical circuitry of a resistance measuring probe designed to measure the thickness of an electrically conductive coating applied in a joint hole formed in a layer of composite material.

FIG. 11 is a circuit diagram representing a resistance measuring circuit 36 designed to measure a resistance that is indicative of the thickness of coating 12 applied in a joint hole 20 formed in a composite layer 30. (The composite material on the other side of the hole 20 is not shown in FIG. 11.) In the scenario depicted in FIG. 11, the resistance measuring circuit 36 is measuring the effective resistance of a coating 12 made of LMA and the random parallel resistance of the carbon fibers in a composite layer 30 made of CFRP in series. This measurement is accomplished by placing a capacitive sensing pad 38 having an annular shape in contact with an annular portion of the surface of the composite layer 30 that surrounds the hole 20. Although not shown in FIG. 11, the capacitive sensing pad 38 includes a dielectric coating 39 (see FIG. 16) with an electrically conductive sensing element (e.g., a copper plate, film or coating) attached to one side of the dielectric coating. The dielectric coating 39 can maintain a space between the sensing element and the composite layer 30 to prevent a short circuit. As a result, the sensing pad 38 and the confronting portion of the composite layer 30 form a capacitor having a capacitance C1.

Figure 14:
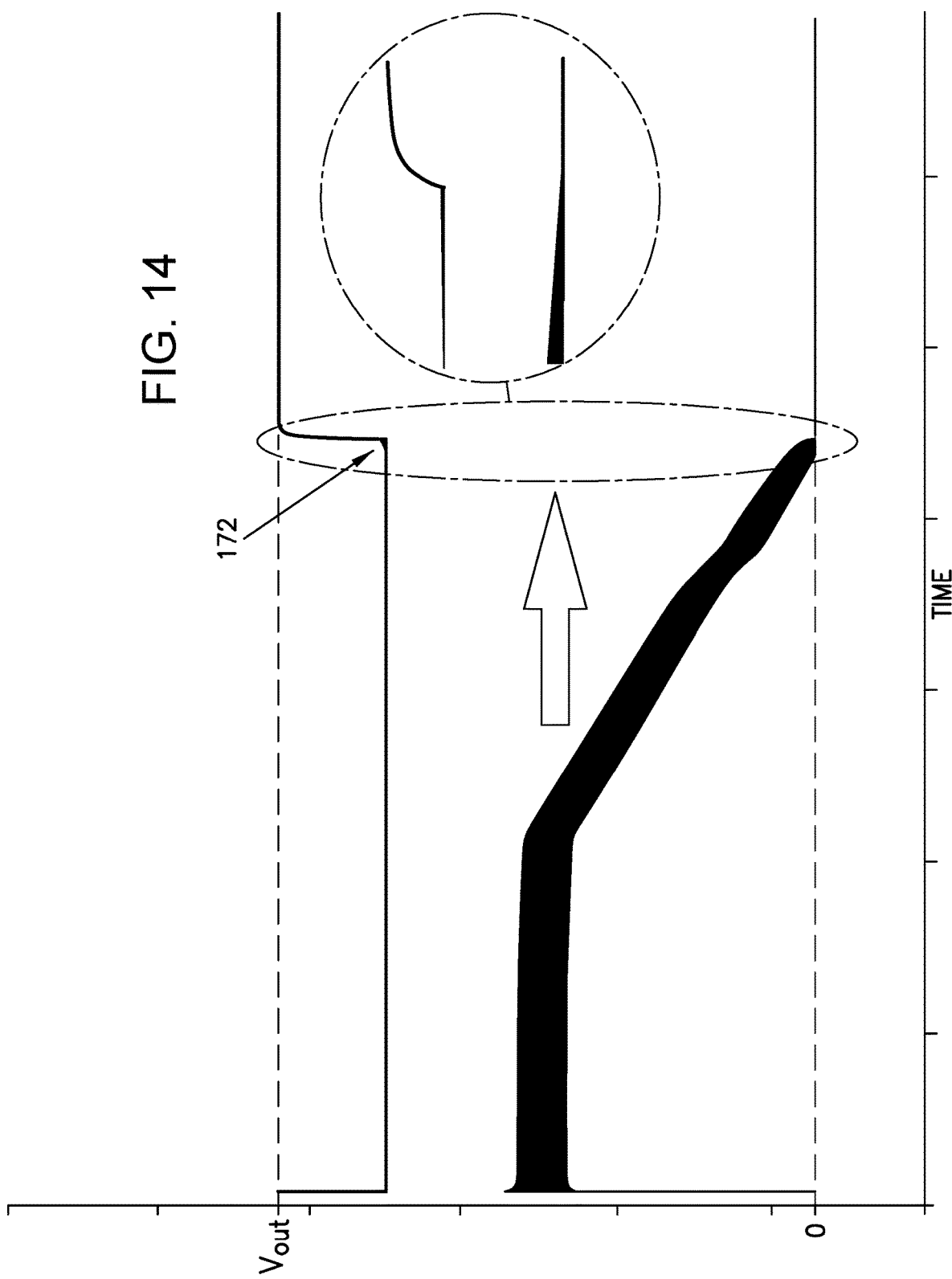
FIG. 14 includes two graphs of voltage versus time: the upper graph shows how the output voltage $V_{out}$ changes significantly when the hole resistance reaches the desired value; the lower graph shows how the A-B bridge output voltage decreases as the hole resistance approaches the desired value.

The resistance measuring circuit 36 includes a pair of terminals A and B which form a modified resistance-capacitance (RC) Wheatstone bridge 130. (A Wheatstone bridge is an electrical circuit used to measure an unknown electrical resistance by balancing two legs of a bridge circuit, one leg of which includes the unknown component.) The sensing pad 38 is electrically connected to terminal B. The terminal A is connected to one side of a capacitor 160 having a capacitance C2. The other side of capacitor 160 is connected in series to a resistance R2, which is in turn electrically connected in series to the applicator 40 by way of a junction 170. The effective resistance of coating 12 and composite layer 30 in series is represented by a variable resistance R9 (hereinafter "effective resistance R9") in FIG. 11. The effective resistance R9 varies in dependence on the degree of carbon fiber connectivity to the coating 12. The applicator 40 is also electrically connected in series by way of junction 170 to a high-frequency alternating current source 136, which provides a high-frequency alternating current during coating deposition. That high-frequency alternating current flows through the rotating applicator 40, through the coating 12 and into the composite layer 30, producing a displacement current in the sensing pad 38. As the thickness of the coating 12 increases, the effective resistance R9 decreases until the resistance R9 equals the resistance R2. As shown in FIG. 14, the voltage difference between the A-B terminals of modified RC Wheatstone bridge 130 decreases as the effective resistance R9 decreases.

Still referring to FIG. 11, the voltage difference between the A-B terminals of modified RC Wheatstone bridge 130 is input to an operational amplifier 138. The output terminal 7 of operational amplifier 138 is connected to a negative input terminal 9 of an operational amplifier 140 by way of a rectifier 164 (although represented as a single diode, rectifier 164 may include multiple diodes) and a resistance R7 in series. The operational amplifier 139 operates as a comparator which compares the effective resistance R9 (which is variable) to resistance R2 (which is adjustable). More specifically, resistance R2 can be heuristically evaluated over many separate measurements of what one might consider a satisfactory interface. The resistance R2, which is dependent on the application or the installation configuration, particularly for different material systems, could be very different values. The resistance R2 can be easily adjusted with a series of predefined resistances R2, very similar to range selection of a multimeter.

Returning attention to FIG. 11, the positive input terminal of the operational amplifier 140 is connected to ground by way of a junction 166 located between the high-frequency alternating current source 136 and ground. In addition, junction 166 is electrically connected: to a junction 168 (situated between junction 170 and the high-frequency alternating current source 136) by way of a resistance R6; to terminal A by way of a resistance R4; and to terminal B by way of a resistance R3.

The operational amplifier 138 has first and second input terminals 3 and 5. The first input terminal 3 receives alternating current from the alternating current source 136 after it has flowed through a composite layer 30 having a hole 20, an electrically conductive body (e.g., hole applicator 40 in FIG. 11 or fastener 2 in FIG. 12) disposed inside the hole 20 and electrically connected to the alternating current source 136, a coating 12 made of electrically conductive material disposed between the electrically conductive body and the hole 20, and a sensing pad 38 capacitively coupled to the composite layer 30 and electrically connected to the first terminal 3 of operational amplifier 138. The second input terminal 5 receives alternating current from the alternating current source 136 after it has flowed through the fixed resistance R2 and the capacitor 160. The capacitor 160 has one side electrically connected to the fixed resistance R2 and another side electrically connected to the second terminal 5 of operational amplifier 138.

The output terminal of operational amplifier 140 is electrically connected to the negative input terminal 9 of operational amplifier 140 by way of a capacitor 162 having a capacitance C3 and by way of a resistance R8 in parallel. The resistance R7, operational amplifier 140, capacitor 162, and resistance R8 form an integrator 134. The output terminal of operational amplifier 140 is also electrically connected to a first output terminal 142. A second output terminal 144 is electrically connected to ground by way of junction 166. Thus, the output voltage $V_{out}$ between first and second output terminals 142 and 144 is the output voltage of operational amplifier 140. The operational amplifier 140 performs the mathematical operation of integration with respect to time; that is, the output voltage is proportional to the input voltage integrated over time, as seen in FIG. 14, which shows the output voltage $V_{out}$ versus time as the thickness of the coating 12 being deposited in the hole 20 increases.

Figure 13:
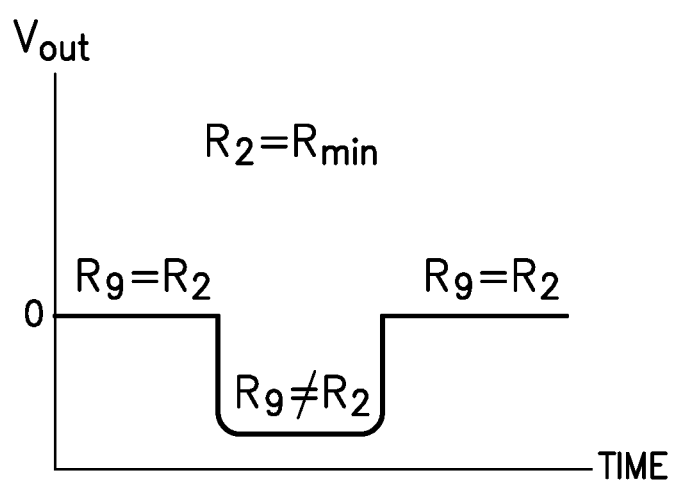
FIG. 13 is a graph of the output voltage $V_{out}$ of the circuitry depicted in FIG. 11 versus time that shows how the output voltage $V_{out}$ varies in dependence on whether the variable resistance R9 is equal to fixed resistance R2 or not.

FIG. 13 is a graph of the output voltage $V_{out}$ of the circuitry depicted in FIG. 11 versus time that shows how the output voltage $V_{out}$ varies in dependence on whether the variable effective resistance R9 is equal to fixed resistance R2 or not. As seen in the graph of FIG. 13 and the upper graph in FIG. 14, the output voltage $V_{out}$ increases suddenly when the value of the effective resistance R9 changes from R9≠R2 to R9=R2.

The effective resistance R9, for all practical purposes, solely depends on the fiber connectivity at the hole interface. This means that the resistance of LMA alone is negligible compared to the resistance of the carbon fibers and, because the current goes through the thin layer of LMA perpendicularly, the resistance becomes practically zero. In other words, the resistance of the interface with the LMA depends on fiber connectivity only and is independent of the LMA application steps.

One benefit of the resistance measuring circuit 36 depicted in FIG. 11 is the capacitive coupling of the sensing pad 38 with the composite layer 30 that allows the resistance to be measured with one contact point only. The resistance measurement can be used to determine when the thickness of a coating 12 being applied by an electrically conductive applicator 40 reaches a desired thickness. As previously mentioned, a resistance R2 is selected that corresponds to the resistance of a coating having the desired thickness. Accordingly, when R9=R2, the coating deposition process can be terminated.

Figure 15:
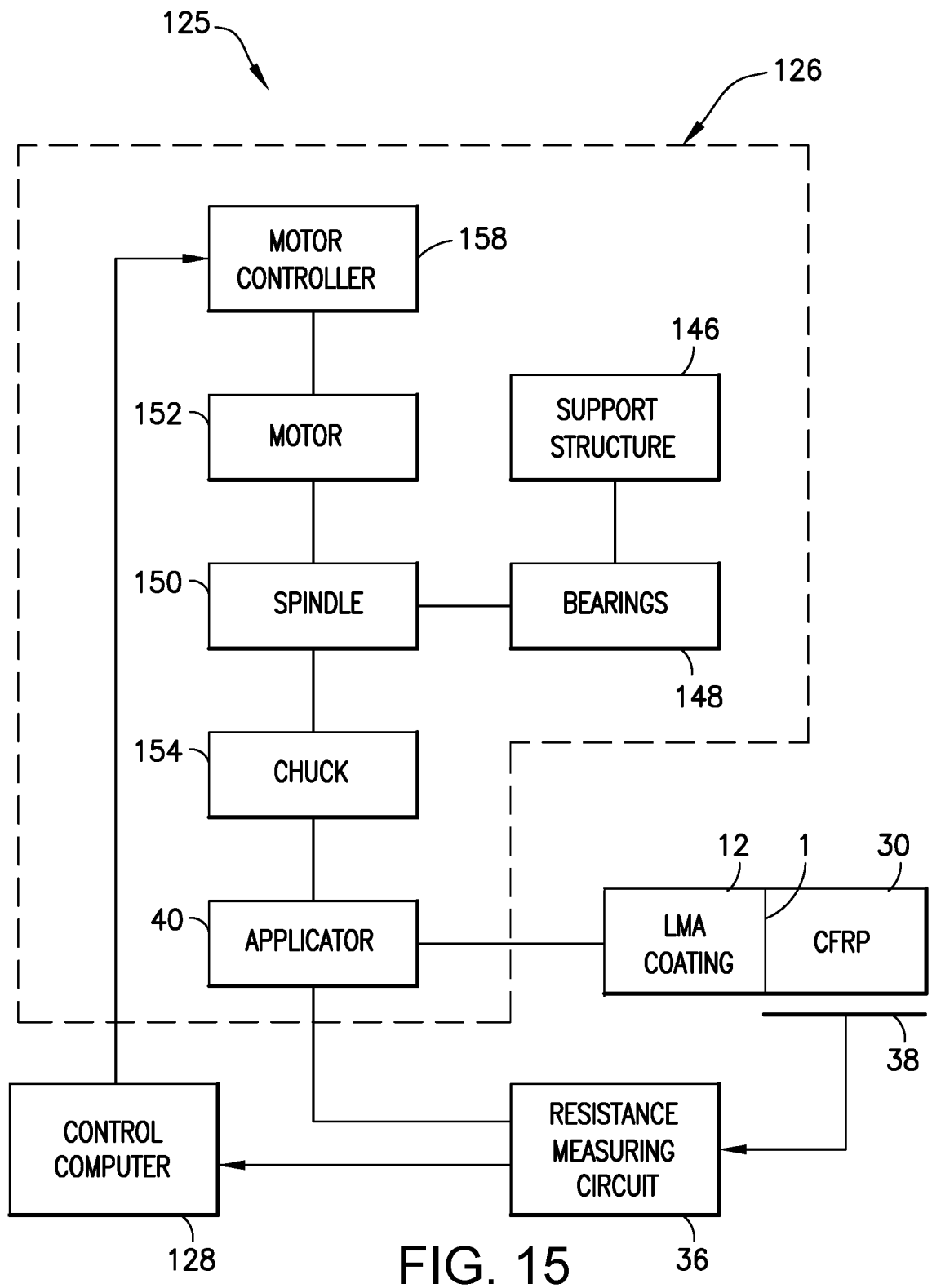
FIG. 15 is a block diagram identifying components of a system for monitoring the thickness of an electrically conductive coating deposited in a joint hole in a composite layer including CFRP by measuring an effective resistance at the hole interface.

FIG. 15 is a block diagram identifying components of a system 125 for monitoring the thickness of a coating 12 made of electrically conductive material deposited on a surface defining a hole 20 in a composite layer 30 including CFRP by measuring an effective resistance at the hole interface 1. The system 125 includes an apparatus 126 that is under the command of a control computer 128. The apparatus 126 includes a support structure 146, bearings 148, a spindle 150, a motor 152, a chuck 154, a hole coating applicator 40; and a low-melting alloy pad (not shown in FIG. 15). The bearings 148 are supported by the support structure 146. The spindle 150 is rotatably supported by the bearings 148. The motor 152 is mechanically coupled to the spindle 150 for driving rotation of the spindle 150. The chuck 154 is coupled to a distal end of the spindle 150. The hole coating applicator 40 includes a shaft (not shown in FIG. 15) made of a material that is not a low-melting alloy and clamped by the chuck 154. The low-melting alloy pad is supported by the shaft and radially movable relative to the shaft. The support structure 146 may take the form of an articulated robot arm (not shown in the drawings).

During rotation of the spindle 150, the applicator 40 applies coating 12 on a surface defining a hole 20 formed in the composite layer 30. A sensing pad 38 is capacitively coupled to the composite layer 30. The resistance measuring circuit 36 (shown in detail in FIG. 11) can be connected to the applicator 40 (which is made of electrically conductive metal alloy) and to the sensing pad 38 (which is made of electrically conductive metal or metal alloy). The output voltage $V_{out}$ from the resistance measuring circuit 36 is received by the control computer 128, which commands the motor controller 158 in dependence on the output voltage level. On the one hand, if the output voltage $V_{out}$ has a level indicating that the effective resistance R9 is not equal to the resistance R2, then the control computer 128 does not send a command to the motor controller 158 instructing the motor controller 158 to turn off the motor 152. On the one hand, if the output voltage $V_{out}$ has a level indicating that the effective resistance R9 is equal to the resistance R2, then the control computer 128 sends a command to the motor controller 158 instructing the motor controller 158 to turn off the motor 152.

Figure 17:
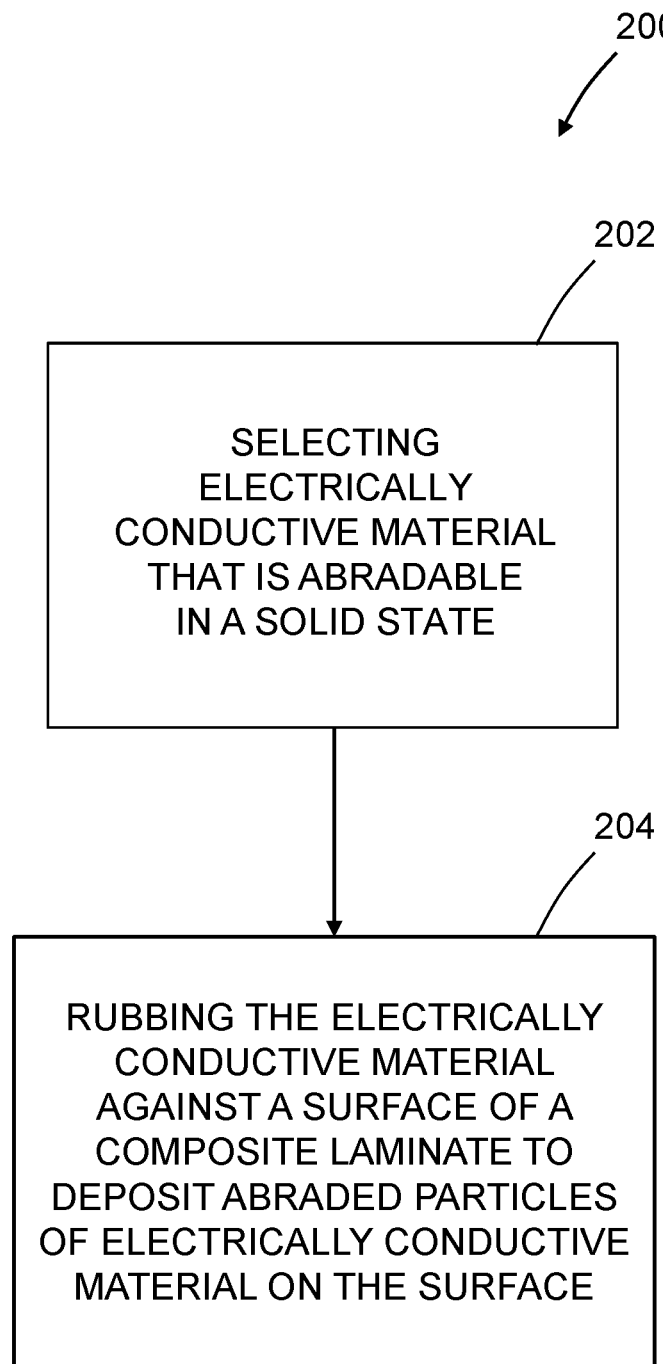
FIG. 17 is a flowchart identifying steps of a method for applying a coating on a surface of a lamination of plies of fiber-reinforced plastic material.

FIG. 17 is a flowchart identifying steps of a method 200 for applying a coating 12 on a surface of a lamination of plies of fiber-reinforced plastic material. The surface (which may define a hole 20 or form an edge 21) of the lamination includes exposed ends of reinforcement fibers. The method 200 includes selecting an electrically conductive material that is abradable in a solid state by rubbing against the surface of the lamination having exposed ends of reinforcement fibers (step 202). The method 200 further includes rubbing the electrically conductive material against the surface of the lamination to cause particles of electrically conductive material to be abraded and deposited on the surface of the lamination (step 204).

Figure 18:
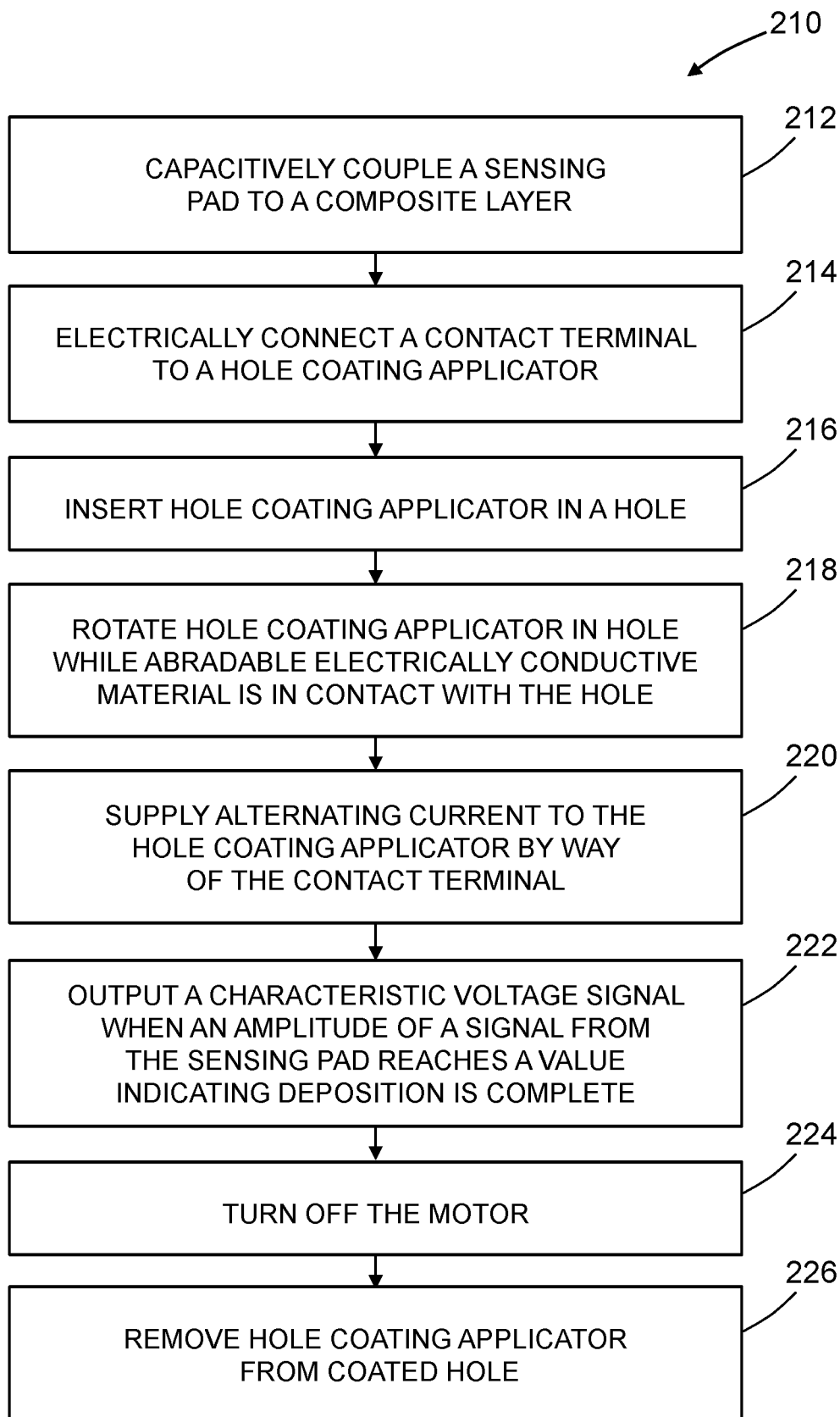
FIG. 18 is a flowchart identifying steps of a method for applying a coating on a hole of a composite layer using the system depicted in FIG. 15.

FIG. 18 is a flowchart identifying steps of a method 210 for applying a coating 12 on a surface defining a hole 20 of a composite layer 30 using the system 125 depicted in FIG. 15. The sensing pad 38 of the resistance measuring circuit 36 is capacitively coupled to the composite layer 30 (step 212). A contact terminal of the resistance measuring circuit 36 is electrically connected to the hole coating applicator 40 (step 214). The hole coating applicator 40 is inserted in the hole 20 (step 216). The hole coating applicator 40 is rotated in the hole 20 while the abradable electrically conductive material is in contact with the hole 20 to cause particles of the electrically conductive material to be abraded and deposited on the surface defining hole 20 (step 218). An alternating current is supplied from the resistance measuring circuit 36 to the hole coating applicator 40 by way of the contact terminal (step 220). While the alternating current is being supplied, the resistance measuring circuit 36 outputs a characteristic voltage signal to the control computer 160 when an amplitude of a signal from the sensing pad 38 reaches a value that is indicative that a desired amount of electrically conductive material has been deposited on the surface defining hole 20 (step 222). In response to receipt of the characteristic voltage signal, the control computer 160 sends a control signal to the motor controller 158 instructing it to turn off the motor 152 (step 224), which causes the hole coating applicator 40 to stop rotating. The hole coating applicator 40 is then removed from the coated hole 22 (step 226).

Figure 19:
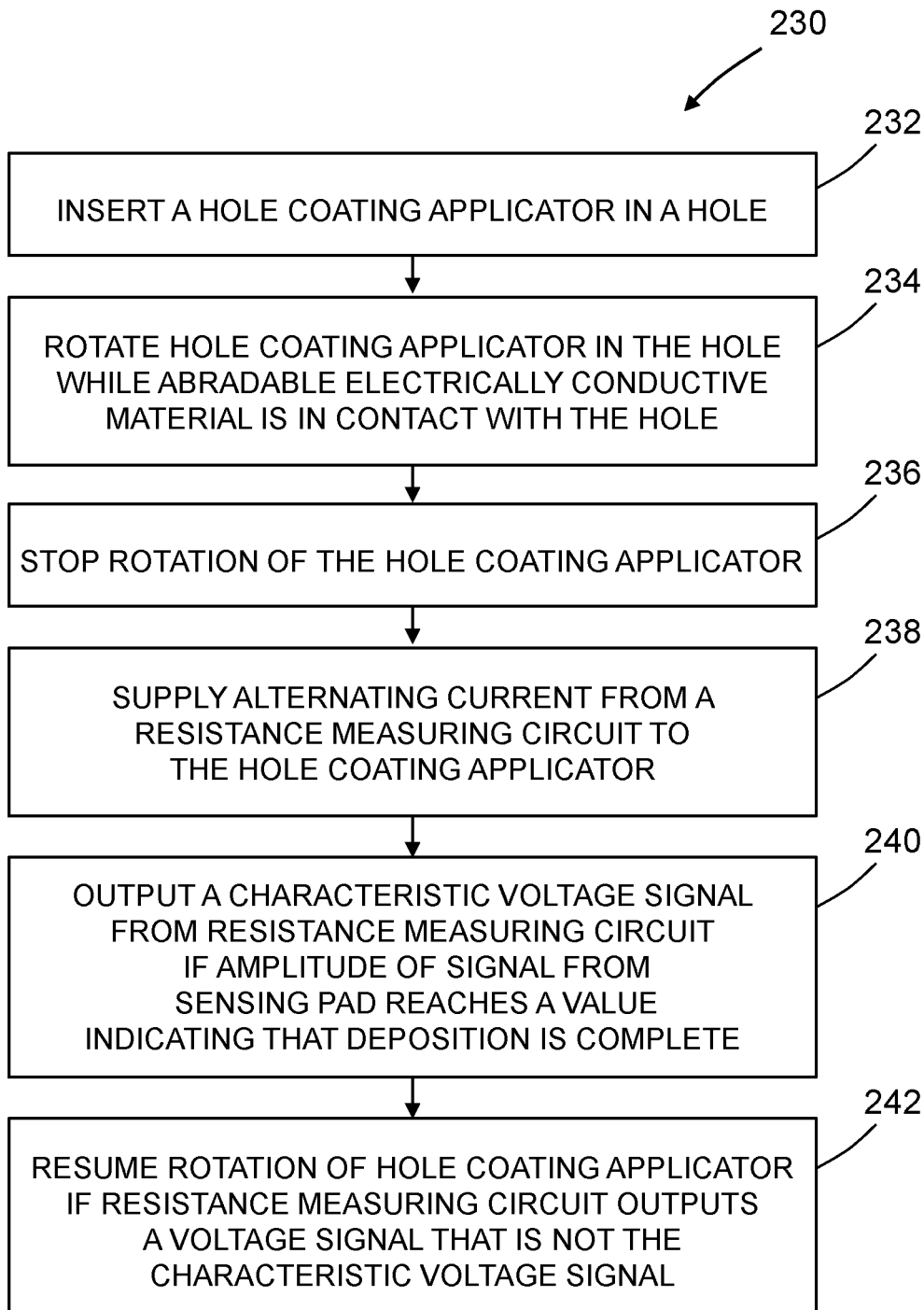
FIG. 19 is a flowchart identifying steps of a method for measuring a contact resistance at an interface of an electrically conductive coating and a cross-ply surface of a composite layer made of fiber-reinforced plastic having electrically conductive fibers.

FIG. 19 is a flowchart identifying steps of a method 230 for measuring a contact resistance at an interface of an electrically conductive coating and a cross-ply surface of a composite layer made of fiber-reinforced plastic having electrically conductive fibers. The hole coating applicator 40 is inserted in the hole 20 (step 232). Then the hole coating applicator 40 is rotated in the hole 20 while the abradable electrically conductive material is in contact with the hole 20 to cause particles of the electrically conductive material to be abraded and deposited on the surface defining hole 20 (step 234). At some point in time, rotation of the hole coating applicator 40 is stopped (step 236). While the hole coating applicator 40 is not rotating, an alternating current is supplied from the resistance measuring circuit 36 to the hole coating applicator 40 (step 238). While the alternating current is being supplied, a characteristic voltage signal is output from the resistance measuring circuit 36 if an amplitude of a signal from the sensing pad 38 reaches a value that is indicative that a desired amount of electrically conductive material has been deposited on the surface defining the hole 20 (step 240). Rotation of the hole coating applicator 40 is resumed if the resistance measuring circuit 36 outputs a voltage signal that is not the characteristic voltage signal (step 242).

Figure 12:
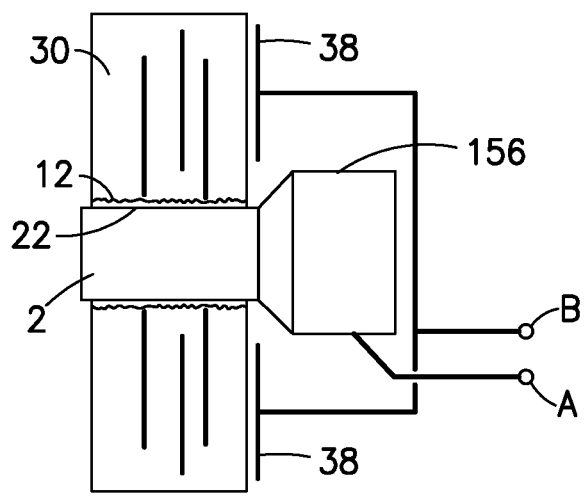
FIG. 12 is a diagram showing the placement of a sensing pad around a coated hole in which a fastener is being inserted for use in measuring the thickness of the electrically conductive coating.

The resistance measurement technology disclosed above can also be used to check the thickness of a coating 12 during the insertion of a fastener 2 into a coated hole 22. FIG. 12 is a diagram showing a sensing pad 38 (only partly shown) placed around a coated hole 22. The sensing pad 38 has the shape of an annular ring and is preferably placed concentric to the hole 20. FIG. 12 shows the fastener 2 being held by the fastener inserter 156 during measurement of the effective resistance R9. The same resistance measuring circuit 36 can be used. In this scenario, terminal A of the resistance measuring circuit 36 is connected to the fastener 2 (which is made of electrically conductive metal alloy) while terminal B is connected to the sensing pad 38. If the resistance measuring circuit 36 outputs a voltage indicating that the effective resistance R9 is at least equal to the selected resistance R2 (representing the desired coating thickness), then the coating thickness is deemed acceptable and installation of the fastener can be completed by coupling a mating part (not shown) to the threaded end of the fastener 2 and then disengaging and retracting the fastener inserter 156.

Figure 16:
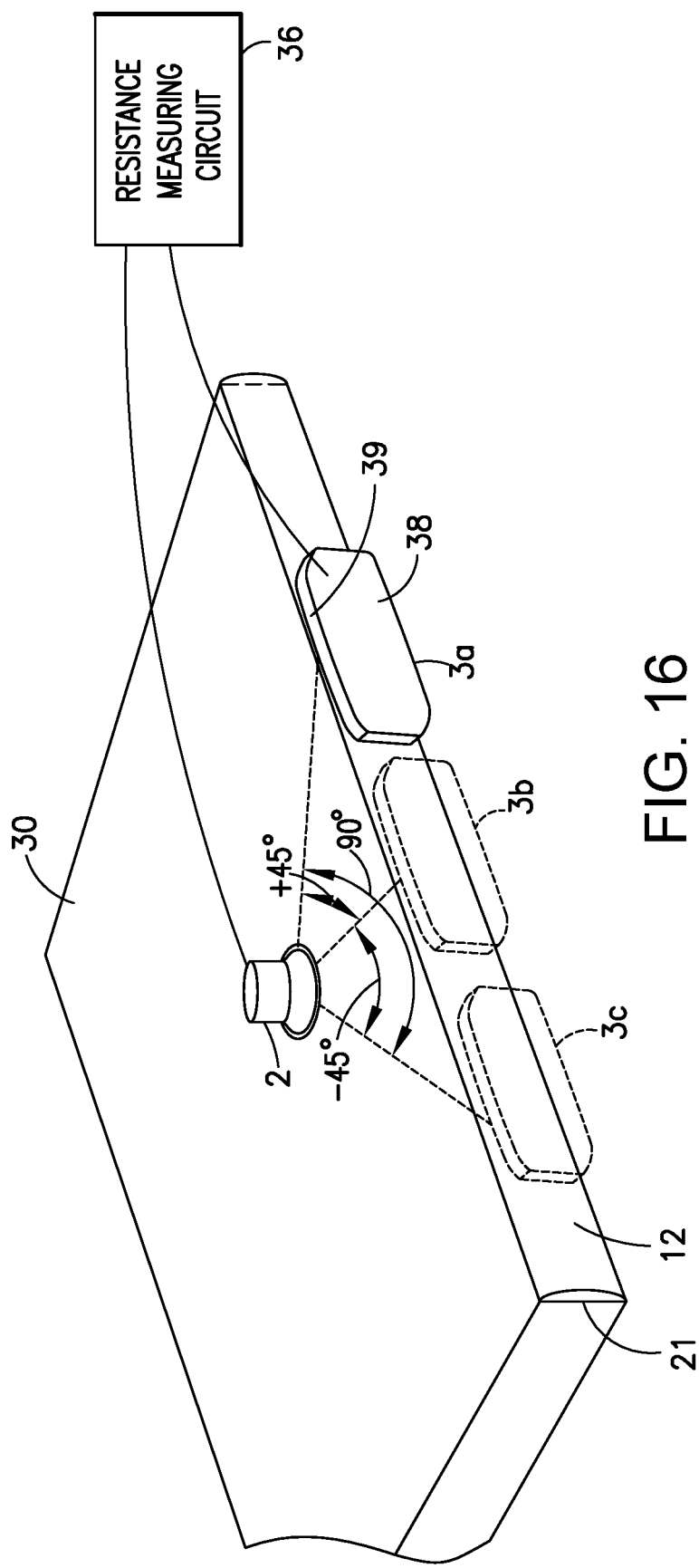
FIG. 16 is a diagram identifying components of a system for monitoring the thickness of an electrically conductive coating deposited on an edge of a composite layer including CFRP by measuring an effective resistance with reference to a near-edge fastener.

As previously mentioned, the resistance measuring circuit 36 depicted in FIG. 11 can also be used to measure the thickness of a coating applied on an edge 21 of a composite layer 30. FIG. 16 is a diagram identifying components of a system for monitoring the thickness of an electrically conductive coating 12 deposited on an edge 21 of a composite layer 30 including CFRP by measuring an effective resistance with reference to a near-edge fastener 2. The composite layer 30 includes a stack of plies, the carbon fibers in each ply being mutually parallel to each other, but different plies having different fiber orientations. In the example depicted in FIG. 16, some plies have fibers oriented at a 90-deg angle, some plies have fibers oriented at a +45-deg angle and some plies have fibers oriented at a −45-deg angle. Thus, any electric spark produced at the fastener 2 could travel from the fastener 2 toward the edge 21 along fibers that are oriented in any of the three directions. Accordingly, it would be of interest to know the thickness of the coating 12 at each of the three preferred locations indicated by the location of the sensing pad 38 seen in FIG. 16 and the two other locations indicated by dashed outlines of the sensing pad.

The sensing pad 38 has a specific surface area (e.g., 1 $cm^2$). By knowing what the target resistance value should be, one can measure the pad resistance for any given area of a planar surface coated with LMA. What this signifies is how complete the contact is between the coating 12 and the CFRP edge 21 at any given region under the sensing pad 38. The applied force on the sensing pad 38 should stay the same (for consistency) throughout the measurements, because the interface contact resistance and capacitance depend on the compression as well.

The term "sensing pad" as used herein refers to the capacitive element over the CFRP surface in FIG. 11 or overlying the coating 12 in FIG. 16. The sensing pad 38 has a dielectric coating 39 to prevent any incidental short circuit. For the hole resistance measurement, a simplest shape is a flat circular plate with a central hole (referred to herein as an "annular ring"). The hole allows the applicator insertion to the CFRP through it. For edge measurement, no hole is necessary and the plate size may vary based on the ply thickness. The effective surface area and the combined dielectric constant are the key variables that determine the effective capacitance. The shape of the two-dimensional contour does not change the capacitance but the shape must be chosen to conform to the geometry of the area under test. The simplest shape for edge measurement would be a rectangular plate with width equal to the ply thickness and a proper length to produce an effective capacitance within the range of the proposed resistance measuring circuit.

As disclosed above, the resistance measuring circuit 36 can be used to measure a contact resistance at an interface of an electrically conductive coating and a cross-ply surface of a composite layer made of fiber-reinforced plastic having electrically conductive fibers. The cross-ply surface may define a hole in or form an edge of the composite layer. In accordance with one embodiment, a sensing pad is placed on a surface of the composite layer, as shown in FIG. 11. In accordance with another embodiment, a sensing pad is placed on a coated edge of the composite layer, as shown in FIG. 16. These embodiments share common steps identified in FIG. 21.

Figure 21:
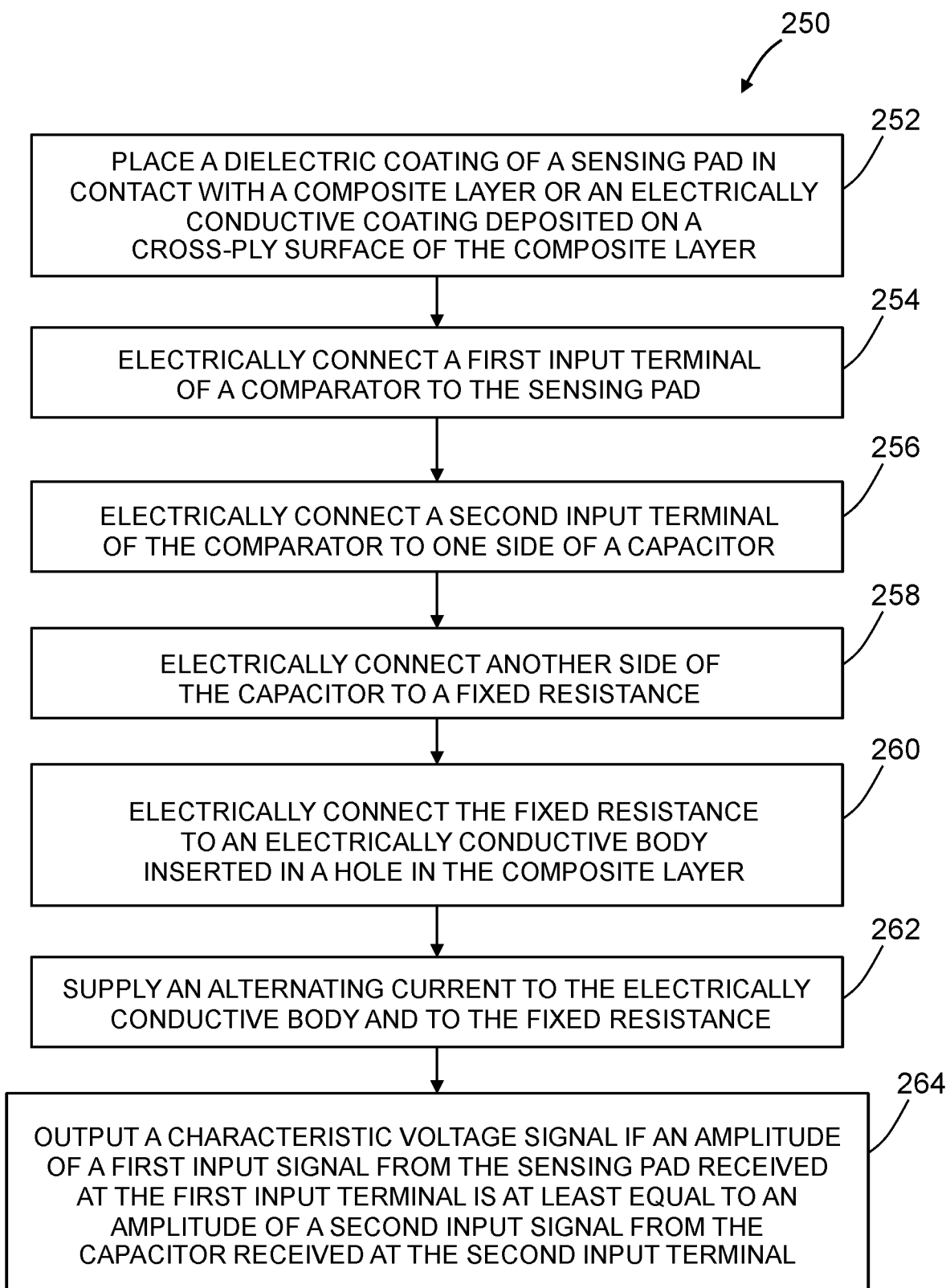
FIG. 21 is a flowchart identifying steps of a method for measuring a contact resistance at an interface of an electrically conductive coating and a cross-ply surface of a composite layer made of fiber-reinforced plastic having electrically conductive fibers.

More specifically, FIG. 21 is a flowchart identifying steps of a method 250 for measuring a contact resistance at an interface of an electrically conductive coating and a cross-ply surface of a composite layer made of fiber-reinforced plastic having electrically conductive fibers. The method 250 includes the following steps. First, a dielectric coating of a sensing pad is placed in contact with the composite layer or with the electrically conductive coating on the cross-ply surface of the composite layer (step 252). Then a first input terminal of a comparator is electrically connected to the sensing pad (step 254) and a second input terminal of the comparator is electrically connected to one side of a capacitor (step 256). Another side of the capacitor is electrically connected to a fixed resistance (step 258). The fixed resistance is electrically connected to an electrically conductive body (e.g., a fastener) inserted in a hole in the composite layer (step 260). To perform the measurement, an alternating current is supplied to the electrically conductive body and to the fixed resistance (step 262). While the alternating current is being supplied, a characteristic voltage signal is output by the comparator if an amplitude of a first input signal from the sensing pad received at the first input terminal of the comparator is at least equal to an amplitude of a second input signal from the capacitor received at the second input terminal of the comparator (step 264). In accordance with one embodiment of the method described in the preceding paragraph, the cross-ply surface of the composite layer defines a hole and the electrically conductive body is a fastener or a hole coating applicator inserted in the hole. In accordance with another embodiment of the method described in the preceding paragraph, the electrically conductive coating is disposed on an edge of the composite layer near the fastener. The method may further include: depositing electrically conductive material on the hole to form the electrically conductive coating until a time when the characteristic voltage signal is output; and ceasing depositing of electrically conductive material on the hole after the characteristic voltage signal is output.

Lastly, the resistance monitoring techniques disclosed herein are not limited in application to determining the thickness of an electrically conductive coating that interfaces with CFRP along cross-ply surfaces. In instances where a certain specific physical parameter can be related (e.g., by an equation) to its electrical resistance, the resistance measuring method disclosed herein could be used to accurately measure that parameter indirectly. For example, if an interface resistance were very sensitive to humidity or temperature, then methods disclosed herein could be used to indirectly measure the parameter of interest accurately through the change in the electrical resistance, which depends on the parameter of interest.

While systems, systems, apparatus and methods for measuring the electrical contact resistance at an interface of a cross-ply surface of a CFRP laminate and a coating made of electrically conductive material (e.g., LMA) have been described with reference to various embodiments, it will be understood by those skilled in the art that various changes may be made and equivalents may be substituted for elements thereof without departing from the scope of the claims set forth hereinafter. In addition, many modifications may be made to adapt the teachings herein to a particular situation without departing from the scope of the claims.

The method claims appended hereto should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatingly unless the claim language explicitly states a condition that precludes such an interpretation.

The invention claimed is:

1. A method for measuring a contact resistance at an interface of an electrically conductive coating and a hole in a composite layer made of fiber-reinforced plastic having electrically conductive fibers, the method comprising:
   placing a dielectric coating of a sensing pad in contact with a surface of the composite layer;
   electrically connecting a first input terminal of a comparator to the sensing pad;
   electrically connecting a second input terminal of the comparator to one side of a capacitor;
   electrically connecting another side of the capacitor to a fixed resistance;
   electrically connecting the fixed resistance to an electrically conductive body that is in contact with the electrically conductive coating in the hole in the composite layer;
   supplying an alternating current to the electrically conductive body and to the fixed resistance; and
   while the alternating current is being supplied, outputting a characteristic voltage signal if an amplitude of a first input signal from the sensing pad received at the first input terminal of the comparator is at least equal to an amplitude of a second input signal from the capacitor received at the second input terminal of the comparator.

2. The method as recited in claim 1, further comprising selecting an electrically conductive body that is a fastener, and inserting the fastener in the hole in contact with the electrically conductive coating.

3. The method as recited in claim 1, further comprising selecting an electrically conductive body that is a hole coating applicator, inserting the hole coating applicator in the hole, and depositing the electrically conductive coating on the hole using the hole coating applicator.

4. The method as recited in claim 3, wherein placing a dielectric coating comprises selecting a sensing pad that is annular and placing the sensing pad so that it surrounds an opening of the hole.

5. The method as recited in claim 3, further comprising:
   depositing electrically conductive material on the hole to form the electrically conductive coating until a time when the characteristic voltage signal is output; and
   ceasing depositing of electrically conductive material on the hole after the characteristic voltage signal is output.

6. The method as recited in claim 1, further comprising selecting electrically conductive fibers that are carbon fibers.

7. The method as recited in claim 1, further comprising selecting an electrically conductive coating that is made of a meltable alloy.

8. The method as recited in claim 1, wherein the fixed resistance is equal to a target contact resistance at the interface.

9. The method as recited in claim 7, wherein the meltable alloy has a melting temperature in a range greater than 170° F. and less than 300° F.

10. The method as recited in claim 7, wherein the meltable alloy is a mixture of bismuth, indium and tin.

11. The method as recited in claim 1, wherein the surface of the composite layer is a surface of a ply.

12. The method as recited in claim 5, further comprising ceasing depositing the electrically conductive coating on the hole using the hole coating applicator in response to outputting the characteristic voltage signal.

13. A method for measuring a contact resistance at an interface of an electrically conductive coating and an edge of a composite layer made of fiber-reinforced plastic having electrically conductive fibers, the method comprising:
   placing a dielectric coating of a sensing pad in contact with the electrically conductive coating;
   electrically connecting a first input terminal of a comparator to the sensing pad;
   electrically connecting a second input terminal of the comparator to one side of a capacitor;
   electrically connecting another side of the capacitor to a fixed resistance;
   electrically connecting the fixed resistance to an electrically conductive body that is in contact with a hole in the composite layer;
   supplying an alternating current to the electrically conductive body and to the fixed resistance; and
   while the alternating current is being supplied, outputting a characteristic voltage signal if an amplitude of a first input signal from the sensing pad received at the first input terminal of the comparator is at least equal to an amplitude of a second input signal from the capacitor received at the second input terminal of the comparator.

14. The method as recited in claim 13, further comprising disposing the electrically conductive coating on an edge of the composite layer near the electrically conductive body.

15. The method as recited in claim 13, further comprising selecting electrically conductive fibers that are carbon fibers.

16. The method as recited in claim 13, further comprising selecting an electrically conductive coating that is made of a meltable alloy.

17. The method as recited in claim 16, wherein the meltable alloy has a melting temperature in a range greater than 170° F. and less than 300° F.

18. The method as recited in claim 16, wherein the meltable alloy is a mixture of bismuth, indium and tin.

19. The method as recited in claim 13, wherein the fixed resistance is equal to a target contact resistance at the interface.

* * * * *